United States Patent
Shimizu et al.

(10) Patent No.: US 7,977,693 B2
(45) Date of Patent: Jul. 12, 2011

(54) SEMICONDUCTOR LIGHT-EMITTING MATERIAL WITH TETRAHEDRAL STRUCTURE FORMED THEREIN

(75) Inventors: Tatsuo Shimizu, Tokyo (JP); Kazushige Yamamoto, Yokohama (JP); Shigeru Haneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 983 days.

(21) Appl. No.: 11/531,426

(22) Filed: Sep. 13, 2006

(65) Prior Publication Data

US 2007/0145394 A1    Jun. 28, 2007

(30) Foreign Application Priority Data

Dec. 22, 2005   (JP) ................... 2005-370250

(51) Int. Cl.
*H01L 33/00* (2010.01)

(52) U.S. Cl. ....... 257/98; 252/301.16; 257/97; 257/103; 257/E27.128; 257/E31.102; 372/43.01

(58) Field of Classification Search ............ 252/301.16; 257/184, 97, 98, 103, E27.128, E31.102; 372/43.01

See application file for complete search history.

(56) References Cited

U.S. PATENT DOCUMENTS 6,488,771 B1 * 12/2002 Powell et al. ................ 117/89
2003/0179795 A1 * 9/2003 Moriya et al. ................. 372/46

OTHER PUBLICATIONS

U.S. Appl. No. 12/409,693, filed Mar. 24, 2009, Yamamoto, et al.

H.W.A.M. Rompa, et al., "Predicted Modifications in the Direct and Indirect Gaps of Tetrahedral Semiconductors", Physical Review Letters, vol. 52, No. 8, Feb. 20, 1984, pp. 675-678.

D.M. Wood, et al., "Electronic Structure of Filled Tetrahedral Semiconductors", Physical Review B, vol. 31, No. 4, Feb. 15, 1985, pp. 2570-2573.

N. Buerger, et al., "New Class of Related Optical Defects in Silicon Implanted with the Noble Gases He, Ne, Ar, Kr, and Xe", Physical Review Letters, vol. 52, No. 18, Apr. 30, 1984, pp. 1645-1648.

Warren E. Pickett, et al., "Effects of Strain on the Band Structure of Diamond", SPIE vol. 877 Micro-Optoelectronic Materials, 1988, pp. 64-69.

M. Ohfuti, et al., "First-Principles Total-Energy Calculations of Atomic and Electronic Structure in Relaxed $Si_{1-x-y}Ge_xC_y$", Physical Review B, vol. 60, No. 19, Nov. 15, 1999, pp. 547-554.

U.S. Appl. No. 11/845,412, filed Aug. 27, 2007, Yamamoto, et al.
U.S. Appl. No. 11/533,149, filed Sep. 19, 2006, Yamamoto, et al.
U.S. Appl. No. 11/688,595, filed Mar. 20, 2007, Yamamoto, et al.
U.S. Appl. No. 12/207,178, filed Sep. 9, 2008, Yamamoto, et al.
U.S. Appl. No. 11/837,932, filed Aug. 13, 2007, Shimizu, et al.

(Continued)

*Primary Examiner* — Hung Vu
*Assistant Examiner* — Vernon P Webb
(74) *Attorney, Agent, or Firm* — Oblon, Spivak, McClelland, Maier & Neustadt, L.L.P.

(57) ABSTRACT

A semiconductor light-emitting material includes a semiconductor substance including a matrix semiconductor whose constituent atoms are bonded to form a tetrahedral structure, an impurity atom S substituted for an atom in a lattice site of the matrix semiconductor, and an impurity atom I inserted in a interstitial site of the matrix semiconductor, the impurity atom S and the impurity atom I being bonded through charge transfer therebetween in a state that the impurity atom S has an electric charge coincident with that of the constituent atom of the matrix semiconductor and the impurity atom I has an electron configuration of a closed shell structure, in which the semiconductor substance is stretched in a direction of a bond forming the tetrahedral structure.

8 Claims, 17 Drawing Sheets

OTHER PUBLICATIONS

U.S. Appl. No. 12/617,104, filed Nov. 12, 2009, Yamamoto, et al.
B. Bouhafs, et al., "Predicted Modifications in the Direct and Indirect Gaps of Si" Solid State Communications, vol. 96, No. 4, 1995. pp. 245-250.

\* cited by examiner

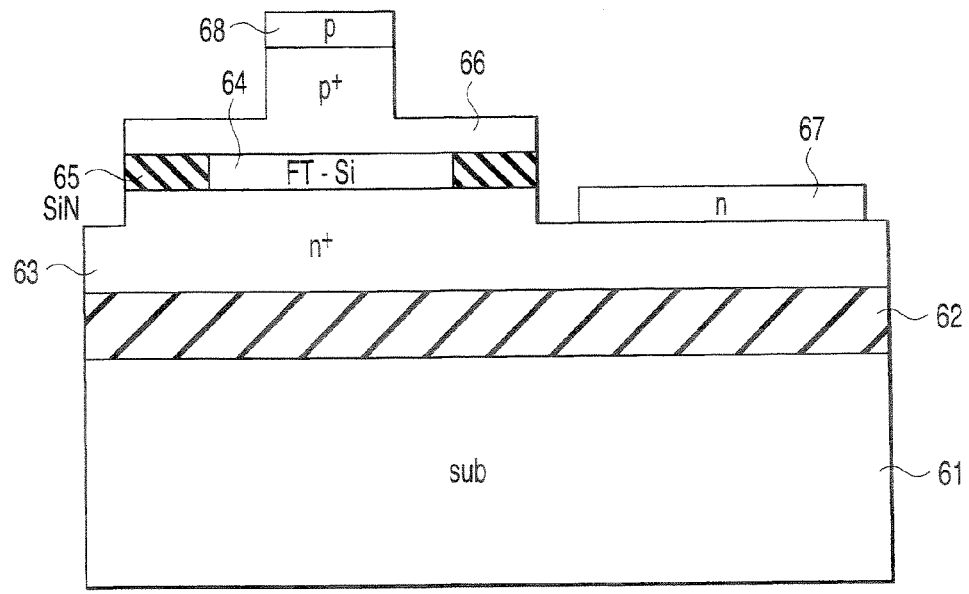
F I G. 14 A
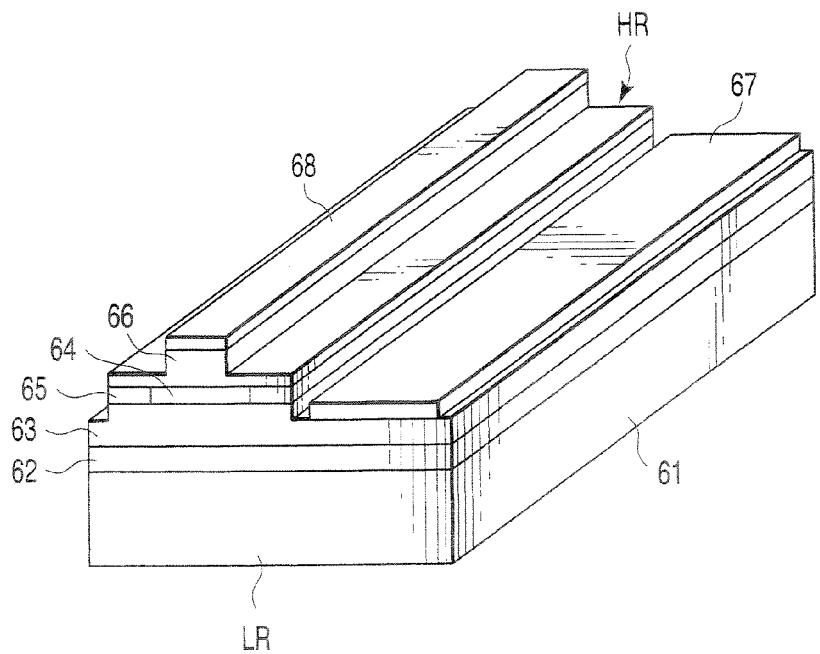
F I G. 14 B

SEMICONDUCTOR LIGHT-EMITTING MATERIAL WITH TETRAHEDRAL STRUCTURE FORMED THEREIN

CROSS-REFERENCE TO RELATED APPLICATIONS

This application is based upon and claims the benefit of priority from prior Japanese Patent Application No. 2005-370250, filed Dec. 22, 2005, the entire contents of which are incorporated herein by reference.

BACKGROUND OF THE INVENTION

1. Field of the Invention

The present invention relates to a semiconductor light-emitting material and a light emitting device.

2. Description of the Related Art

Silicon, which is a typical electronic material supporting electronics, has been considered unsuitable for application in the optical field. This is because silicon is of an indirect transition type and the conduction band and valence band of silicon are p-orbital (odd function), making silicon unsuitable for application in the optical field. The essential points of these reasons are said to reside in the preservation of the wave number not being established and the matrix component of the dipole moment being made very small.

A nano-particle technology and a superlattice technology are known as prior arts of the silicon light emitting device. The emission mechanism in the nano-particle technology is considered to be based on the "confinement effect". The emission mechanism in the superlattice technology is considered to be based on the "zone-folding effect". These two effects have substantially the same function and are intended to make the band structure of silicon into direct transition type. However, both the conduction band and the valence band contain mainly the p-orbital component. It is theoretically impossible for the silicon light emitting device based on these techniques to emit light at high efficiency and high speed. To be more specific, each of the "confinement effect" and the "zone-folding effect" simply brings about a pseudo-dipole transition. Therefore, it is not expected intense emission using only any one of the effects. Therefore, it has been impossible for the conventional silicon light-emitting device to exhibit sufficient characteristics and to be put into a practical use.

In the case of utilizing the confinement effect which has been considered most hopeful, a serious problem resides in that it is unavoidable to introduce a high electronic barrier. It is difficult to inject a current over the high electronic barrier, so that the electroluminescence (EL) by the current injection method is inhibited.

As described above, conventional research has been concentrated on the idea of converting silicon into a substance of a direct transition type. However, practically required is a band modulating technology in which one of the conduction band and the valence band is made to be an s-orbital band (even function), with the other is left to be a p-orbital band (odd function). Further, required is a method that permits the emission by the current injection without introducing any electronic barrier.

Conventional techniques relating to the silicon light-emitting device other than those based on the confinement effect and the zone-folding effect referred to above are also known to the art as follows:

Rompa et al. found from band calculation of GaAs that the X-point energy is raised in the GaAs having He introduced into the interstitial site of GaAs, as described in Phys. Rev. Lett., 52, 675 (1984). This is called a filled tetrahedral (FT) semiconductor. Since GaAs is a direct transition type semiconductor that permits emission at high speed, a prominent effect is not produced even if the X-point is raised, though the possibility of modulating the X-point is pointed out. However, the document does not show at all to the modulation of the Γ-point relating to the improvement in the emission efficiency of the indirect semiconductor.

It is reported by Burger et al. in Phys. Rev. Lett., 52, 1645 (1984) that the FT semiconductor prepared by ion-implantation of rare gas such as He, Ne, Ar, Kr and Xe into a silicon wafer generates PL emission in the energy level of approximately 1 eV. However, the PL emission ceases to be generated if the wafer is annealed at a temperature of several hundred degrees. It follows that the FT semiconductor containing a rare gas is expected to be low in thermal stability and, thus, to be impracticable.

Pickett et al. teach change in the band structure in the case of applying a uniaxial stress to carbon, as described in SPIE vol. 877 Micro-Optoelectronic Materials 64 (1988). However, even if carbon is converted into a material of a direct transition type, a light emitting device having high efficiency and operated at high speed cannot be expected if the amount of the s-orbital component of the conduction band remains to be small. Further, the discussion given in the document covers the case where uniaxial strain as high as 4% is introduced into a very hard carbon, which is impossible to achieve actually. As a matter of fact, any experiment covering the particular situation is not shown.

As described above, conventional techniques have a serious problem that it is impossible to modulate sufficiently the band structure of an indirect semiconductor, e.g., silicon. Since an orbital component cannot be changed, it is impossible to use effectively a matrix component of dipole moment. Also, in the case of utilizing the confinement effect, the electrons will be confined by a high electronic barrier, leading unavoidably to a problem that current injection is made difficult.

BRIEF SUMMARY OF THE INVENTION

According to an aspect of the present invention, there is provided a semiconductor light-emitting material, comprising: a semiconductor substance whose constituent atoms are bonded to form a tetrahedral structure which is stretched in a direction of a bond.

According to another aspect of the present invention, there is provided a semiconductor light-emitting material, comprising: a semiconductor substance comprising: a matrix semiconductor whose constituent atoms are bonded to form a tetrahedral structure; an impurity atom S substituted for an atom in a lattice site of the matrix semiconductor; and an impurity atom I inserted in a interstitial site of the matrix semiconductor, the impurity atom S and the impurity atom I being bonded through charge transfer therebetween in a state that the impurity atom S has an electric charge coincident with that of the constituent atom of the matrix semiconductor and the impurity atom I has an electron configuration of a closed shell structure, wherein the semiconductor substance is stretched in a direction of a bond forming the tetrahedral structure.

According to another aspect of the present invention, there is provided a light emitting device, comprising: an active layer comprising the aforementioned semiconductor light-emitting material; and an n-electrode and a p-electrode which supply a current to the active layer.

BRIEF DESCRIPTION OF THE SEVERAL VIEWS OF THE DRAWING

FIGS. 14A and 14B are a cross-sectional view and a perspective view, respectively, showing an edge-emitting LD device according to a ninth embodiment;

DETAILED DESCRIPTION OF THE INVENTION

Embodiments of the present invention will be described more in detail.

The present inventors have conducted extensive research on methods of modulating the band structure of a semiconductor having a tetrahedral structure. As a result, we have arrived at the present invention. The feature of the present invention resides in band engineering for modulating the band structure of a semiconductor having a tetrahedral structure. The mechanism of the main band engineering in the present invention resides in the bond stretching effect. Further, it is possible to utilize, as a second mechanism, the effect of excluding interstitial state in the FT semiconductor, in combination with the above effect. These effects will be described in detail.

(1) "Bond stretching effect" in a semiconductor having a tetrahedral structure:

The substances having a tetrahedral structure include, for example, GaAs which is a direct transition type semiconductor, and silicon which is an indirect transition type semiconductor. Whether the substance is of the direct transition type or the indirect transition type is determined by the combination of the constituent elements, the properties of the constituent elements such as electronegativity and a bonding radius, and a lattice constant.

Figure 1A:
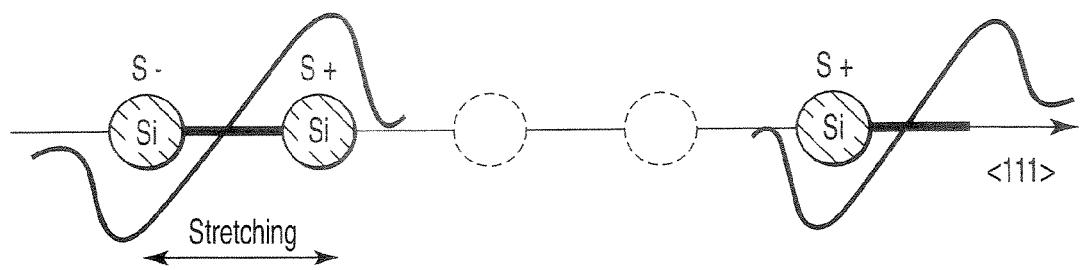
FIG. 1A shows an electronic state in a real space in respect of the Γ-point conduction band of silicon.
Figure 1B:
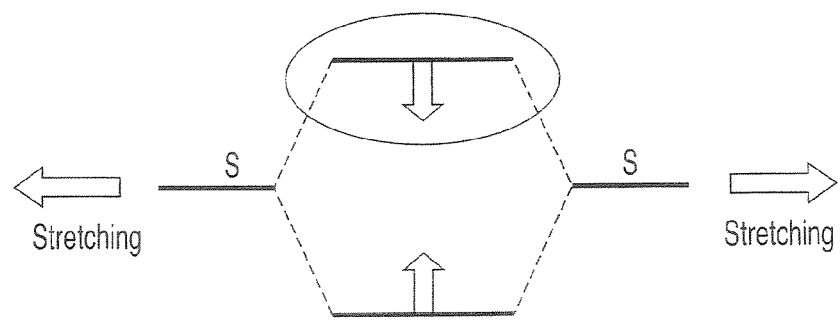
FIG. 1B schematically shows the directions of changes in conduction band and in valence band caused by stretching of a Si—Si bond.

In respect of a substance having a tetrahedral structure, the present inventors have conducted research on change in the band structure which is brought about when the bond length between two atoms has been changed. As a result, it has been found that, if the bond length between the two atoms is increased, the conduction band is greatly lowered in the Γ-point and the bottom of the Γ-point is put in the state resembling the s-orbital, although a significant change is not observed in the X-point. Roughly speaking, if the bond between the two atoms is stretched, the repulsive energy between electrons is decreased so as to lower the anti-bonding orbital forming the conduction band and to approach a bonding orbital forming the valence band. FIGS. 1A and 1B schematically show the situation described above. FIG. 1A shows an electronic state in a real space for the Γ-point conduction band (Γc) in the silicon diamond structure. FIG. 1B schematically shows the directions in changes of the anti-bonding orbital (conduction band) and the bonding orbital (valence band), which are caused by stretching of the Si—Si bond. If the Si—Si bond is stretched as shown in FIG. 1A, the anti-bonding orbital (conduction band) is lowered as shown in FIG. 1B so as to approach the bonding orbital (valence band).

Figure 2A:
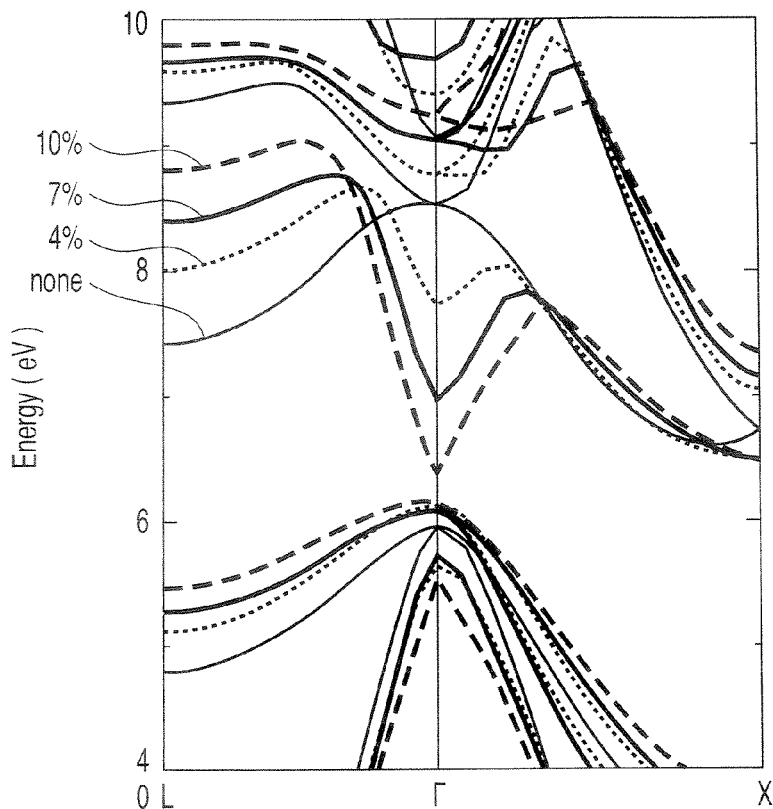
FIG. 2A shows changes in the band structure in the case of stretching a bulk Si in the <111> direction.

FIG. 2A is a diagram showing changes in the band structure in the case where a bulk Si is stretched in a Si—Si bond direction, i.e., the <111> direction in this case. Analysis of calculation results shows that, if the bond length is stretched in an amount not smaller than 1%, the s-orbital component is rapidly increased at the bottom of the conduction band at the Γ-point. Further, if the stretched amount of the bond length is increased to 4%, 7% and 10%, the bottom of the conduction band at the Γ-point is made sharper, as shown in FIG. 2A.

Figure 2B:
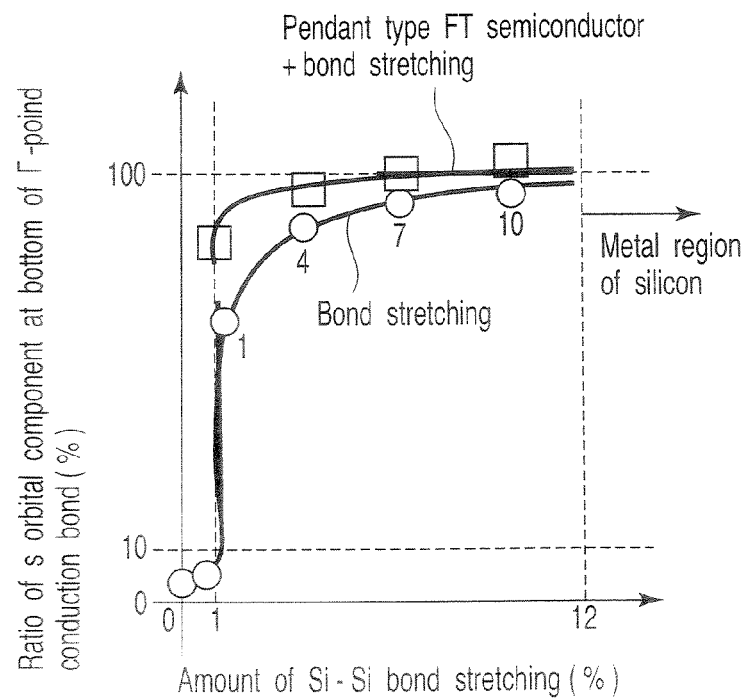
FIG. 2B is a graph showing the relationship between the amount of the Si—Si bond stretching and the ratio of s-orbital component at the bottom of the conduction band at the Γ-point.

FIG. 2B is a graph showing the relationship between the amount of the Si—Si bond stretching and the ratio of s-orbital component at the bottom of the conduction band at the Γ-point. If the bond stretching is not introduced, the s-orbital component is 10% or less. On the other hand, if the bond length is stretched by at least 1%, the s-orbital component is rapidly increased. It should be noted, however, that, if the bond stretching exceeds 12%, the bottom of the conduction band is brought into contact with the valence band, so that silicon is made into metal.

The semiconductor substance having a tetrahedral structure, which is included in the semiconductor light-emitting material according to an embodiment, is stretched in at least one of the four bonding directions of each atom, taking the local paired atoms bonded through a bond into consideration.

FIGS. 2A and 2B show the result in the case where a (111) substrate is compressed in-plane so as to stretch the substrate in the <111> direction. Note that directions equivalent to the <111> direction include <−111>, <1-11> and <11-1>. The stretched structure of the Si—Si bond may be distributed at random. To be more specific, the substrate may be stretched in the <111> direction in a certain region and stretched in the <11-1> direction in another region.

Also, the bond length of each of the other three bonds (back bonds) of each atom may be unchanged or increased. It is important that each of these bond lengths is not decreased. Where a (100) substrate is stretched as a whole in the <001> direction by in-plane compression, the bond angle alone is changed without bringing about actually the stretching of the bond. As a result, an increase in the s-orbital component, which is produced by the bond stretching effect, is not observed. On the other hand, where the (111) substrate is stretched as a whole in the <111> direction by in-plane compression, the bond is greatly stretched actually in the <111> direction, and the other three back bonds are also stretched. In this case, it is possible to increase the s-orbital component by the bond stretching effect.

From a different viewpoint, the semiconductor substance having a tetrahedral structure, which is included in the semiconductor light-emitting material according to an embodiment, has an angle smaller than 110° among the three other back bonds of each atom. When the angle among the three back bonds is made to be 90°, the s-orbital component becomes a maximum value of 100%. When the angle is 110°, the semiconductor substance assumes an $Sp^3$ structure. When the angle is 120°, the semiconductor substance assumes an $Sp^2$ structure and the ratio of the p-orbital component becomes 100%. As described above, if the angle among the three back bonds becomes 110° or less, the ratio of the s-orbital component is increased and the efficiency is more improved. Incidentally, the angle among the back bonds is changed even in the case where a (100) substrate is stretched as a whole in the <001> direction by in-plane compression. However, the angles among the back bonds include one larger than 110°, and the p-orbital component is increased in that portion. On the other hand, where a (111) substrate is stretched as a whole in the <111> direction by in-plane compression, the angles among the three back bonds are made smaller than 110° and, thus, increase in s-orbital component can be expected.

Incidentally, the angles among the back bonds can be analyzed by XANES. In this method, change in the local structure can be detected from change in the state density.

When an in-plane compression is applied to a (111) substrate as above, the bond stretching and the angle reduction among the back bonds are caused simultaneously, which is advantageous for the increase in the s-orbital component.

As described above, the stretching of the Si—Si bond permits the state in the bottom of the conduction band at the Γ-point to be changed into a state resembling the s-orbital. Also, the s-orbital component is increased with increase in the degree of the bond stretching. The valence band has a peak at the Γ-point, but the state thereof resembles the p-orbital. Here, if the state in the bottom of the conduction band resembles the s-orbital, it is possible to permit the matrix component of the dipole moment to have a finite value at the Γ-point. In other words, even if the bottom of the conduction band does not reside in the Γ-point and thus the substance is of an indirect transition type, it is possible to allow the transition matrix to have a finite value in the case where it is possible to introduce an electron into the bottom of the conduction band at the Γ-point and to introduce a hole to the peak of the valence band. As a result, it is possible to realize emission of short radiative recombination life It. Such a strongly excited state can be realized by any of high-energy light and high electric field.

For example, emission can be achieved by applying a high electric field to a structure of [p-layer/active layer including a bond stretched semiconductor/n-layer] in the forward direction. Even when a diode is manufactured by forming a pn junction using p-type and n-type semiconductor substances having the bond stretched therein, it is possible to permit the diode to emit light as a Zener diode (or as a avalanche diode) by applying a high reverse electric field thereto.

In the conventional indirect semiconductor, since the state in the bottom of the conduction band at the Γ-point is like the p-orbital, it is highly inefficient, making it impossible to achieve sufficiently short radiative recombination life. The present invention has made it possible to permit the state at the bottom of the conduction band to be of the s-orbital, and can realize high efficiency and sufficiently short radiative recombination life.

The bond stretching is employed in the present invention so as to make it possible to provide a method of increasing the s-orbital component even if silicon remains an indirect semiconductor. Such being the situation, the present invention makes it possible to achieve emission under any of the energies 3.2 eV or less. In other words, it is possible to obtain silicon light emitting devices having various wavelengths depending on an amount of bond stretching. In particular, a device (or a phosphor) used in the visible region can be manufactured arbitrarily, leading to high applicability.

Incidentally, in the conventional FT semiconductor comprising a rare gas such as He, emission is generated in a composite of He and a Si defect. If the FT semiconductor is annealed at a temperature of several hundred degrees, it ceases to emit light as described above. On the other hand, in the semiconductor light-emitting material according to the embodiment, emission is generated even under the state that the defect is substantially eliminated by ordinary annealing applied to a semiconductor process, which is approximately 1,050° C. at maximum.

Also, it is indicated in M. Ohfuti et al., Phys. Rev. B60 13547 (1999) that the oscillator strength is not increased in the Si—Ge mixed crystal including the superlattice. Even if Ge is introduced into Si, the Si—Si bond is not stretched, but merely the Si—Ge bond is substantially formed. This is also the case with the superlattice structure. Even if emission is caused, it is not due to change in the Si—Si bond. This also relates to poor emission efficiency of the SiGe superlattice.

Above discussion is summarized as follows. The bond stretching effect denotes the effect of changing the orbital component forming the bottom of the conduction band into the s-orbital by controlling the energy level at the Γ-point of the anti-bonding orbital component forming the conduction band. The particular effect can be produced if the bond is locally stretched, and it is not necessary that the stretching takes place throughout the substance.

Figure 3A:
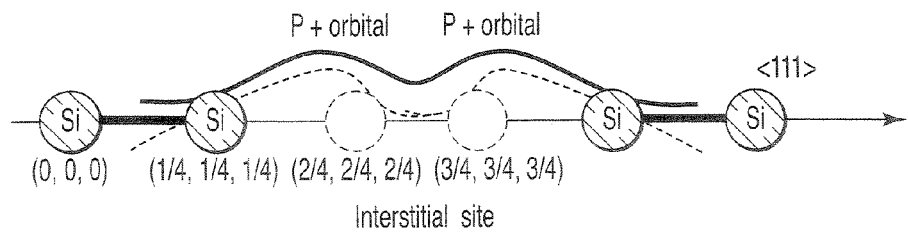
FIGS. 3A, 3B, and 3C show the electronic states in a real space in respect of the X-point conduction band, the Γ-point conduction band, and the Γ-point valence band in the energy bands of silicon.
Figure 3B:
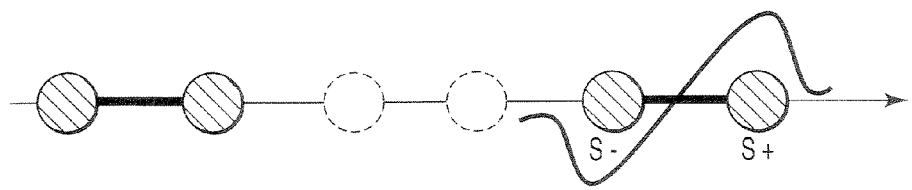
Figure 3C:
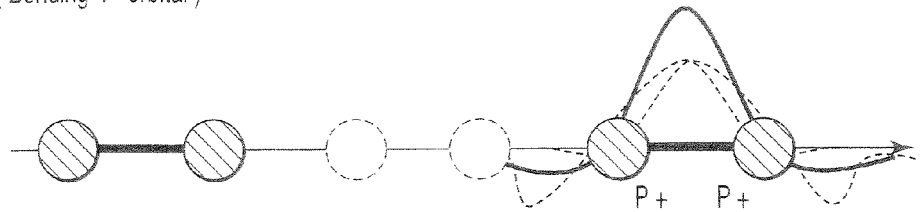

(2) Effect of excluding an interstitial state in the FT semiconductor:

FIGS. 3A, 3B and 3C show the electronic states in the real space in respect of the X-point conduction band (Xc), Γ-point conduction band (Γc) and Γ-point valence band (Γv), respectively, in the diamond structure of silicon.

As shown in FIG. 3A, silicon atoms are positioned at the atomic coordinates (0, 0, 0) and (1/4, 1/4, 1/4) as viewed in the direction of the crystal axis <111> and bonded to each other by the Si—Si bond. Interstitial sites that are called tetrahedral sites are arranged at the atomic coordinates (2/4, 2/4, 2/4) and (3/4, 3/4, 3/4). In the tetrahedral lattice, a crystal structure having a relatively large clearance is formed such that two atoms are arranged, two interstitial sites are arranged, and two atoms are arranged again along the crystal axis <111>.

An atom is not present in the interstitial site. However, since an anti-bonding p-orbital of the silicon atom is expanded toward the interstitial site, the state of the anti-bonding p-orbital is present in the interstitial sites. "Xc" shown in FIG. 3A denotes the electronic state of the interstitial sites.

It should be noted that the FT (filled tetrahedral) semiconductor represents a theoretical substance found by Rompa et al. during the process of calculating the conduction band structure of GaAs. According to the band calculation, it has been found that the X-point energy is raised in the FT-GaAs having He introduced into the interstitial site of GaAs.

Figure 4A:
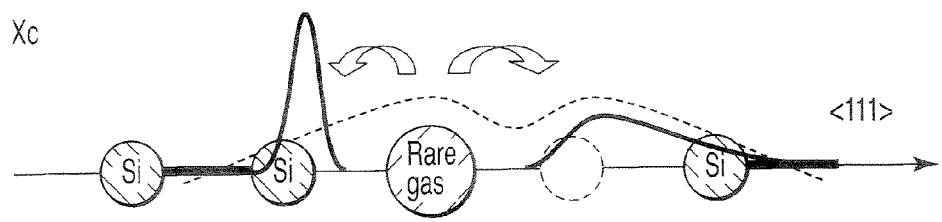
FIGS. 4A, 4B, and 4C schematically show change in energy in the X-point conduction band caused by the FT structure.
Figure 4B:
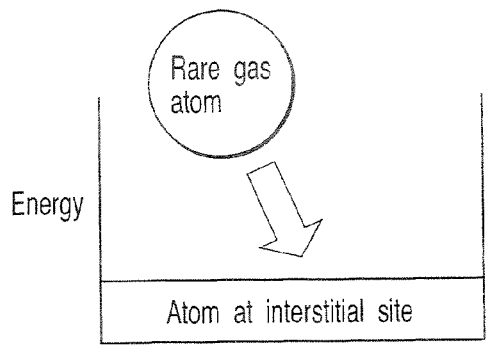
Figure 4C:
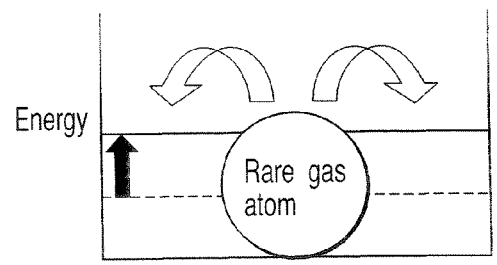

If a rare gas atom (or molecule) of a closed shell structure is introduced into the interstitial site of silicon, the electron in the interstitial site is excluded as shown in FIG. 4A so as to raise the Xc energy. The particular phenomenon is considered to be close to the phenomenon that the water level is raised if a substance is placed in a vessel containing water, as shown in FIGS. 4B and 4C. In other words, the space in which an electron can be present is excluded by a rare gas atom so as to elevate the kinetic energy of the electron at Xc. In this fashion, the energy level in the vicinity of the X-point can be raised by the effect of excluding the interstitial state in the FT semiconductor.

If an atom is present in the interstitial site, it is possible that a deep level or a defect level is formed within the band gap. However, since an atom (or molecule) of a closed shell structure having a wide gap is inserted into the interstitial site in the FT structure, such a level is not formed in principle.

(3) Novel pendant type FT semiconductor:

If the exclusion of the interstitial state in the FT semiconductor can be achieved as in the section (2) above, it is possible to control the energy at the X-point. However, it is substantially impossible to introduce a large amount of, for example, He atoms into the interstitial sites and to retain the He atoms in those sites because the rare gas atoms are released easily by the out diffusion during thermal processes for the semiconductor.

Figure 5:
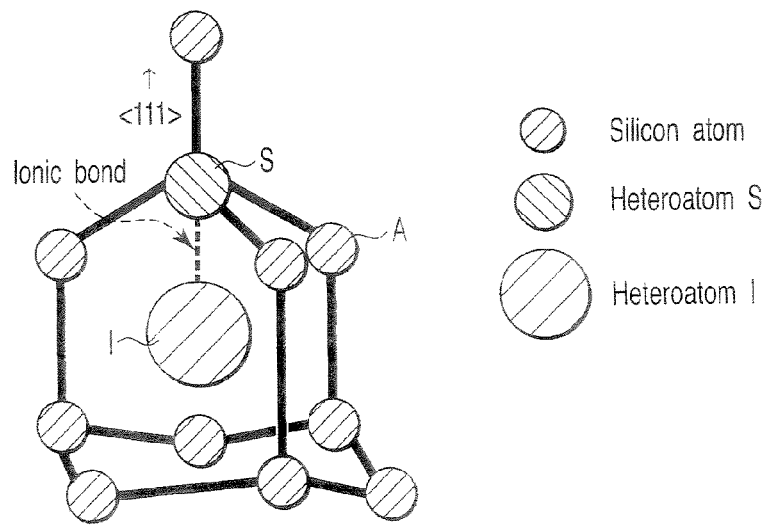
FIG. 5 shows the structure of a pendant type FT semiconductor.

FIG. 5 shows a bonding state of atoms in a novel FT semiconductor according to one embodiment of the present invention. The novel FT semiconductor is referred to as a pendant type FT semiconductor. The pendant type FT semiconductor according to the embodiment comprises atoms A of a matrix semiconductor forming a tetrahedral structure, a heteroatom S substituted for the atom A in a lattice site, and a heteroatom I inserted into an interstitial site positioned closest to the heteroatom S. The heteroatom S has a valence electron number differing by +1 or −1 from that of the atom A and can be substituted for the atom A in the lattice site in the tetrahedral structure and to be ionized. The heteroatom I has an electron configuration of a closed shell structure through charge transfer with the heteroatom S to be ionized. Such being the situation, an ionic bond is formed between the heteroatom S and the heteroatom I so that the heteroatom S performs a function of pinning the heteroatom I. The pendant type FT semiconductor of this particular structure permits improving the thermal stability, thereby overcoming the problem inherent in the rare gas-containing or molecule-containing FT semiconductor. This is because, if the heteroatom S and the heteroatom I are to be pulled away from each other, electrostatic interaction is exerted between the two atoms so as to generate force for maintaining the ionic bond therebetween.

As described above, the candidates for the heteroatom S are those which can form a tetrahedral structure after chemical bonding is attained, and the candidates for the heteroatom I are those which can take an electron configuration of a closed shell structure after chemical bonding is attained.

FIG. 5 shows a pendant type FT semiconductor in which the atom A forming the matrix semiconductor is silicon, the heteroatom S to be substituted for the atom A in the lattice site is phosphorus (P), and the heteroatom I to be inserted into the interstitial site closest to the heteroatom S is fluorine (F). The electron configuration of the P atom is $1s^2 2s^2 2p^6 3s^2 3p^3$, and that of the F atom is $1s^2 2s^2 2p^5$. Charge transfer is exerted between these two atoms so as to form an ionic P$^+$—F$^-$ bond (PF pair). The P$^+$ ion is substituted for the silicon atom in the lattice point so as to assume a tetrahedral structure and, thus, to be stabilized. The F$^-$ ion becomes to have an electron configuration of a closed shell structure like neon (Ne) and, thus, is also stabilized. The SI pairs other than the PF pair will be described hereinafter in detail.

As shown in FIG. 2B, the s-orbital component at the bottom of the conduction band can be further increased at the Γ-point by utilizing (1) the bond stretching in combination with (3) the pendant type FT semiconductor. As a result, emission of high efficiency and short life can be achieved more reliably.

The reason is as follows. The effect on the Γ-point is also generated in the pendant type FT semiconductor because the energy level A of the s-orbital component present in the interstitial space region is raised. The energy level A is raised because the kinetic energy of electron is raised, which corresponds to the elevation of the X-point. The energy level A has interaction with an energy level B of the s-orbital component in the vicinity of the Γ-point of silicon. If the energy level A is raised, the interaction between the energy levels A and B is weakened, so that the energy level B is lowered. Finally, the s-orbital component is increased in the vicinity of the conduction band at the Γ-point.

A reverse principle to that given above is also established. To be more specific, if the energy level B of the s-orbital component is lowered in the vicinity of the Γ-point of silicon by the bond stretching effect, the interaction between the energy levels A and B is weakened, resulting in elevation of the energy level A. This provides finally the factor of the elevation of the X-point of the conduction band.

In this manner, the increase in the s-orbital component at the bottom of the conduction band at the Γ-point is positively related to the energy level elevation of the conduction band at the X-point, and the synergetic effect thereof is very large.

The change shown in FIG. 2B can be explained as an effect produced by introduction of bond stretching into the pendant type FT semiconductor. To be more specific, the X-point is greatly elevated by the pendant type FT semiconductor and the Γ-point is also effected to some extent, so that the PL emission and EL emission can be observed. If bond stretching is introduced into the pendant type FT semiconductor, it is possible to realize emission of higher efficiency and shorter life. This is because the most effective measure for improving the efficiency and for shortening the life is to increase as much as possible the s-orbital component in the state at the bottom of the conduction band at the Γ-point. The s-orbital component in the state at the bottom of the conduction band at the Γ-point may be smaller than 80% in the case of the pendant type FT semiconductor alone. However, it is possible to increase very easily the s-orbital component in the state at the bottom of the conduction band at the Γ-point toward 100% by introducing the bond stretching into the pendant type FT semiconductor.

Further, it is possible for two sets of the heteroatom S and heteroatom I to form a pair so as to form an I—S—S—I structure. In this case, it is possible for the S—S bond to be stretched, and it can be expected to obtain the effect of permitting the state of the bottom of the conduction band at the Γ-point to be like the s-orbital by the bond stretching effect.

What is important in respect of the materials used for manufacturing the pendant type FT semiconductor is that an n-type or a p-type dopant frequently used in the LSI process can be used as it is as the heteroatom S that is substituted for the lattice site. This facilitates the manufacture of the pendant type FT semiconductor so as to lower the manufacturing cost thereof.

Now, the pendant type FT semiconductor will be generally described.

(Tetrahedral Structure)

Various indirect semiconductors having a tetrahedral structure via sp$^3$ hybrid orbital can be used as the solid materials having a tetrahedral structure. To be more specific, the solid materials having a tetrahedral structure include those of a diamond structure such as diamond, silicon and germanium; those of a sphalerite structure such as SiC, GeC, BN, BP, AlP, AlAs, AlSb, and GaP; those of a structure similar to the above such as $Si_xGe_{1-x}$, $Si_xGe_yC_{1-x-y}$, $Ga(P_xAs_{1-x})$, $(Ga_xIn_{1-x})P$, $(Al_xGa_{1-x})As$, $(Al_xGa_{1-x})Sb$, $(Al_xIn_{1-x})Sb$, $(Ga_xIn_{1-x})(P_yAs_{1-y})$, and $(Al_xGa_yIn_{1-x-y})P$, where $0<x<1$, $0<y<0$ and $0<x+y<1$; and those of a wurtzite structure.

(SI Pendant Structure)

The candidates of the impurity atom S for the lattice site and the impurity atom I for the interstitial site constituting the SI pendant structure are combinations of S$^+$—I$^-$ or the S$^-$—I$^+$, where charge transfer is generated between a single impurity atom S and a single impurity atom I, the impurity atom S has a charge coincides with that of the constituent atom of the matrix semiconductor, and the impurity atom I has an electron configuration of a closed shell structure.

Where the matrix semiconductor is formed of a IVb elemental semiconductor or a IVb-IVb compound semiconductor such as diamond, silicon, germanium and SiC, it is possible to use as the SI pair the combination of any of Vb-VIIb and Va-VIIb, or the combination of any of IIIb-Ia, IIIb-Ib, IIIa-Ia or IIIa-Ib.

Where the matrix semiconductor is formed of a IIIb-Vb compound semiconductor such as BN, BP, BAs, AlP, AlAs, AlSb and GaP, and the impurity S is substituted for the IIIb site, it is possible to use as the SI pair the combination of any of IVa-VIIb and IIb-Ia, or the combination of any of IIb-Ib, IIa-Ia and IIa-Ib.

Where the matrix semiconductor is formed of a IIIb-Vb compound semiconductor such as BN, BP, BAs, AlP, AlAs, AlSb and GaP, and the impurity S is substituted for the Vb site, it is possible to use as the SI pair the combination of any of VIb-VIIb and VIa-VIIb, or the combination of any of IVb-Ia, IVb-Ib, IVa-Ia and IVa-Ib.

(ISSI Double Pendant Structure)

The candidates of the impurity atom S for the lattice point and the impurity atom I for the interstitial site constituting the ISSI pendant structure are combinations of 2S$^+$—2I$^-$ or 2S$^-$—2I$^+$, where charge transfer is generated between the two impurity atoms S and the two impurity atoms I, respectively, the impurity atoms S form a pair, and the impurity atoms I have an electron configuration of a closed shell structure.

Where the matrix semiconductor is formed of a IVb elemental semiconductor or a IVb-IVb compound semiconductor such as diamond, silicon, germanium and SiC, it is possible to use as the SI pair the combination of any of Vb-VIIb and Va-VIIb, or the combination of any of IIIb-Ia, IIIb-Ib, IIIa-Ia or IIIa-Ib.

The ISSI pendant structure comprises a matrix semiconductor of a IIIb-Vb compound semiconductor such as BN, BP, BAs, AlP, AlAs, AlSb and GaP, and the two types of the impurity atoms S and S' are substituted for the IIIb site and the Vb site, respectively will be described. In this case, charge transfer is generated between the two types of impurity atoms S, S' and the two types of impurity atoms I, I', respectively, and the impurity atoms S and S' form a pair, and the impurity atoms I and I' have an electron configuration of a closed shell structure. The particular combination includes, for example, (I$^+$—S$^-$)-(S'$^+$—I'$^-$)[(interstitial site-IIIb site)-(Vb site-interstitial site)], (I$^-$—S$^+$)-(S'$^-$—I'$^+$)[(interstitial site-IIIb site)-(Vb site-interstitial site)], (I$^+$—S$^-$)-(S'$^-$—I'$^+$) [(interstitial site-IIIb site)-(Vb site-interstitial site)], and (I$^-$—S$^+$)-(S'$^+$—I'$^+$)[(interstitial site-IIIb site)-(Vb site-interstitial site)]. It should be noted that the pair of the (IIIb site-interstitial site), i.e, S$^+$—I$^-$ or S$^-$—I$^+$, includes the combination of any of IVb-VIIb and IVa-VIIb, or any of IIb-Ia, IIb-Ib, IIa-Ia and IIa-1b. Also, the pair of the (Vb site-interstitial site), i.e., S'$^+$—I'$^-$ or S'$^-$—I'$^+$, includes the combination of any of VIb-VIIb and VIa-VIIb, or any of IVb-Ia, IVb-Ib, IVa-Ia and IVa-Ib.

(Simplified Expression of the Substances)

Each of the expressions Ia, IIa, IIIa, IVa, Va, VIa, VIIa, Ib, IIb, IIIb, IVb, Vb, VIb, and VIIb given above represents the elements of the group given in the periodic table. The expression Ia denotes at least one element selected from the group consisting of Li, Na, K, Rb and Cs. The expression IIa denotes at least one element selected from the group consisting of Be, Mg, Ca, Sr and Ba. The expression IIIa denotes at least one element selected from the group consisting of Sc, Y, La and Lu. The expression IVa denotes at least one element selected from the group consisting of Ti, Zr and Hf. The expression Va denotes at least one element selected from the group consisting of V, Nb and Ta. The expression VIa denotes at least one element selected from the group consisting of Cr, Mo and W. The expression VIIa denotes at least one element selected from the group consisting of Mn and Re. The expression Ib denotes at least one element selected from the group consisting of Cu, Ag and Au. The expression IIb denotes at least one element selected from the group consisting of Zn, Cd and Hg. The expression IIIb denotes at least one element selected from the group consisting of B, Al, Ga, In and Tl. The expression IVb denotes at least one element selected from the group consisting of C, Si, Ge, Sn and Pb. The expression Vb denotes at least one element selected from the group consisting of N, P, As, Sb and Bi. The expression VIb denotes at least one element selected from the group consisting of O, S, Se and Te.

The expression VIIb denotes at least one element selected from the group consisting of F, Cl, Br and I.

The effects based on the bond stretching and the pendant type FT semiconductor described above can be summarized as follows:

(1) The state at the bottom of the conduction band at the Γ-point can be converted into the s-orbital by stretching the bond between the two atoms in the semiconductor substance having a tetrahedral structure. By this method, it is possible to provide a silicon light emitting device of a practical current excitation type having short emission life substantially equal to the level of the photo-semiconductor such as GaAs. Incidentally, the semiconductor need not be modulated into the direct transition type by bond length modulation alone. If it is possible to convert the state at the bottom of the conduction band at the Γ-point into the s-orbital, a practical silicon light emitting device of a current excitation type having short emission life substantially equal to that of GaAs can be provided.

(2) It is possible to raise the electronic energy at the X-point and to raise the X-point of the band structure by making a semiconductor substance having a tetrahedral structure into a pendant type FT structure such that a substance limiting the moving region of the electron is introduced into the interstitial site. By combining the particular effect with the above bond stretching effect, it is possible to provide a silicon light emitting device that can emit light more efficiently and more rapidly, compared with the case of utilizing the bond stretching effect alone. This is because the elevation of the energy at the X-point drastically decreases carriers that escape into non-radiative centers.

(3) A light emitting device producing the effects (1) and (2) given above can be provided in the case of using not only silicon but also another indirect semiconductor.

A light emitting device according to an embodiment of the present invention will be described more in detail.

In the case of manufacturing a light emitting device, what is important is how to introduce the effect produced by bond stretching. This is because the bond stretching enables to make the state at the bottom of the conduction band at the Γ-point into the s-orbital. The conceivable methods of bond stretching include the followings.

(1) If a (111) substrate is used and a film of a substance having a smaller lattice constant or a substance having a thermal expansion coefficient larger than that of the substrate is formed on the substrate, a bond can be stretched in the normal direction to the substrate, i.e., in the <111> direction. It is simplest to stretch the bond in the <111> direction. However, it is also possible to stretch a bond in another direction by using a substrate having another crystal orientation.

(2) If a (111) substrate is used and a film of a substance having a different thermal expansion coefficient than that of the substrate is buried in the substrate so as to apply compressive stress to the substrate in the lateral direction, a bond can be stretched in the normal direction to the substrate, i.e., in the <111> direction. It is simplest to stretch the bond in the <111> direction. However, it is also possible to stretch a bond in another direction by using a substrate having another crystal orientation.

(3) An appropriate SI pair is selected in such a manner that a bond can be stretched locally. For example, it is conceivable to use an AsF pair as the SI pair that brings about locally a large lattice constant. The vibration mode of the SI pair must be seen to be different from that of Si itself.

(4) An appropriate ISSI pair is selected in such a manner that a bond can be stretched locally. The ISSI pair should be selected so as to increase the lattice constant locally or to permit the SS pair to stretch the bond. The vibration mode of the ISSI pair must be seen to be different from that of Si itself. Also, the vibration of the SI pair portion and the vibration of the SS pair portion will appear.

A change is generated in the Raman-active vibration mode by bond stretching. For example, a Raman-active vibration mode appears at 520 cm$^{-1}$ in the case of a Si bulk. However, the bond stretching causes a vibration mode on the low frequency side. In the case of local stretching, if the density of stretched bonds fails to reach $5 \times 10^{19}$ cm$^{-3}$, the peak of the vibration mode may be made broad, so that the peak intensity is made very weak. In such a case, the amount of bond stretching may be seemingly smaller than 1%. Even in such a case, the local emission is sufficiently effective.

The actual bond stretching can be calculated as follows. In the formula given below, $d_e$ represents the density of locally stretched bonds that has been introduced, $d_0$ denotes the bond density of the bulk material, L denotes a strain detection limit in Raman spectroscopy (in the case of using a μspot, L is 0.1%, i.e., 0.001), E denotes the actual amount of bond stretching, and $E_m$ denotes the amount of bond stretching (%) estimated from the measured peak.

(1) Where $d_e/d_0 \leq L$ and the density of locally stretched bonds is low, the actual amount of bond stretching E is represented by the formula given below:

$$E = E_m \times L \times d_0 / d_e$$

In the case of, for example, silicon, the actual amount of bond stretching E is 2.5%, if the values of $E_m$, $d_e$ and $d_0$ are assumed to be: $E_m = 0.5\%$, $d_e = 1 \times 10^{19}$ cm$^{-3}$ and $d_0 = 5 \times 10^{22}$ cm$^{-3}$.

(2) Where $d_e/d_0 \geq L$ and the density of locally stretched bonds is sufficiently high, the actual amount of bond stretching E of the bond is equal to the amount of bond stretching (%) estimated from the measured peak $E_m$ (%).

In the case of manufacturing a light emitting device utilizing both the bond stretching and the pendant type FT semiconductor, an impurity atom S for a lattice site and an impurity atom I for an interstitial site are introduced into the matrix semiconductor, and also a material different from the matrix semiconductor in thermal expansion coefficient is formed as described previously so as to stretch a bond in the <111> direction of the pendant type FT semiconductor. How to manufacture the pendant type FT semiconductor will be described hereinafter.

Figure 6A:
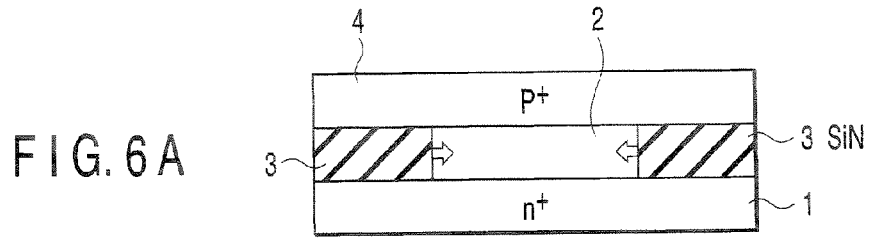
FIGS. 6A and 6B are cross-sectional views showing silicon light emitting devices of a vertical type and a lateral type according to embodiments.
Figure 6B:
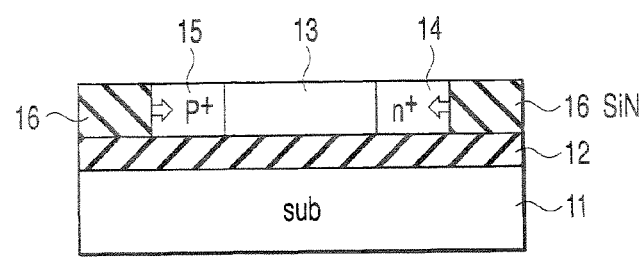

FIGS. 6A and 6B are cross-sectional views showing the silicon light emitting devices according to embodiments of the present invention, wherein FIG. 6A shows a vertical electric field type light emitting device, and FIG. 6B shows a lateral electric field type light emitting device.

The vertical type light emitting device shown in FIG. 6A comprises an n$^+$ layer 1, an active layer 2 and SiN layer 3 formed on the n$^+$ layer 1, and a p$^+$ layer 4 formed to cover the upper surface of the active layer 2 and the SiN layer 3. An n-electrode (not shown) is connected to the n$^+$ layer 1, and a p-electrode (not shown) is connected to the p$^+$ layer 4. Due to difference in thermal expansion coefficient between the active layer 2 and the SiN layer 3, the active layer 2 receives compressive stress from the SiN layer 3 so as to cause a bond to be stretched in the normal direction to the film plane. It is possible that the active layer 2 may be formed of a pendant type FT semiconductor so as to stretch the bond. In this light emitting device, a current is allowed to flow in the vertical direction so as to inject electrons from the n$^+$ layer 1 into the active layer 2 and to inject holes from the p$^+$ layer 4 into the active layer 2, leading to recombination radiation of the electrons and holes in the active layer 2.

The lateral type light emitting device shown in FIG. 6B comprises a semi-insulating silicon substrate 11, a buried oxide film 12 formed within the silicon substrate 11, an active layer 13, an $n^+$ layer 14 and a $p^+$ layer 15 formed flush on the buried oxide film 12 such that the active layer 13 is sandwiched between the $n^+$ layer 14 and the $p^+$ layer 15, and SiN layer 16 formed around the $n^+$ layer 14 and the $p^+$ layer 15, respectively. Due to difference in thermal expansion coefficient, the active layer 13 receives compressive stress from the SiN layer 16 through the $n^+$ layer 14 and the $p^+$ layer 15, so that a bond is stretched in the normal direction to the film plane. It is possible that the active layer 13 may be formed of a pendant type FT semiconductor so as to stretch the bond. An n-electrode (not shown) is connected to the $n^+$ layer 14, and a p-electrode (not shown) is connected to the $P^+$ layer 15. In this light emitting device, a current is allowed to flow in the lateral direction so as to inject electrons from the $n^+$ layer 14 into the active layer 13 and to inject holes from the $p^+$ layer 15 into the active layer 13, leading to recombination radiation of the electrons and holes in the active layer 13.

Incidentally, the light emitting devices shown in FIGS. 6A and 6B represent no more than examples. Needless to say, the device structure other than those shown in these drawings can be employed. For example, a metal can be used for forming the electrode. Also, the stress may be of one-dimensional (uniaxial) or of two-dimensional. It is also conceivable that a stacked film formed on the active layer may be used for stress application in place of SiN layer shown in FIG. 6A. Although each of the SiN layer shown in FIG. 6A and the buried oxide layer shown in FIG. 6B performs a function of preventing current leakage, it is unnecessary to provide the SiN layer or the buried oxide layer in the case where the current leakage can be prevented by any means such as the device structure, the substrate resistance or the circuit.

Also, in the above light emitting device, a pair of the n-electrode and the p-electrode, current source for supplying excited electrons and excited holes, is used as the exciting means. However, for example, an excitation light source, an excitation electron source or an excitation X-ray source may also be as the exciting means.

Next, a method of forming an active layer having an FT structure will be described with reference to FIGS. 7A, 7B, 7C and 7D. The following description covers the case of forming an active layer comprising a PF-doped FT-Si.

Figure 7A:
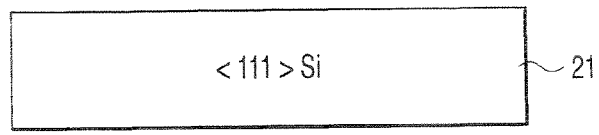
FIGS. 7A, 7B, 7C and 7D are cross-sectional views showing a method of forming an active layer including a PF-doped FT-Si according to an embodiment.
Figure 7B:
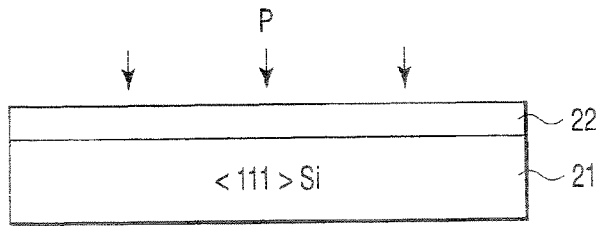

As shown in FIG. 7A, a (111) Si wafer 21 is prepared, and then a prescribed region 22 of the Si wafer 21 is doped with phosphorus (P) as a heteroatom S, as shown in FIG. 7B.

Figure 7C:
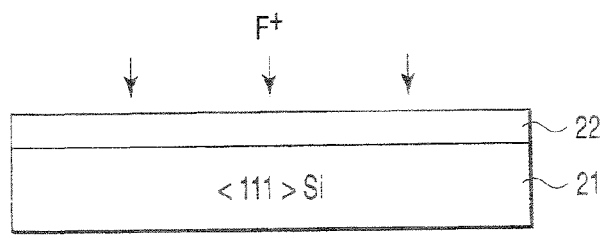

In the next step, fluorine ions ($F^+$) are implanted as heteroatoms I into the prescribed doped region 22 of the Si wafer 21 doped with phosphorus (P), as shown in FIG. 7C. In this ion implantation process, conditions such as the energy, the dose, the orientation of the substrate, the tilt angle and the substrate temperature are optimized. The $F^+$ ion, which is originally an active ion species, receives an extra electron from the phosphorus atom (P) or receives an electron supplied from the ground through the substrate, and becomes the $F^-$ ion with a closed shell structure like a neon (Ne) atom to be made chemically inactive. Therefore, there exists an optimum process in which the $F^+$ ion does not etch the Si wafer.

Figure 7D:
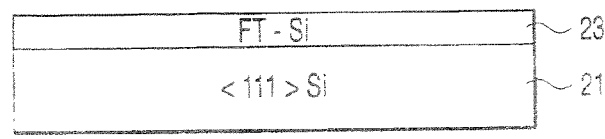

In the step shown in FIG. 7D, the Si wafer 21 is annealed so as to recrystallize the lattice that has been disturbed by ion implantation, thereby forming an active layer 23 comprising FT-Si. In this annealing step, it is possible to replace the silicon atom in the lattice site with the P atom and to insert the F atom to in an interstitial site by controlling, for example, the annealing temperature, the annealing time and the atmosphere. Although the P atom is positioned in the lattice site, the P atom is electrically deactivated because the P atom is deprived of the electron by the F atom. The P atom and the F atom are ionically bonded and, thus, are not dissociated from each other even by temperature raise during annealing, so that their paired state can be maintained.

The light emitting device as shown in FIG. 6A or 6B can be manufactured by further applying an additional process steps. To be more specific, process steps including patterning of the doped region 22 and deposition of the SiN layer are performed so that compressive stress is applied to the active layer 23 including the FT-Si from the SiN layer, thereby stretching a bond in the <111> direction, i.e., in the normal direction to the film plane.

As described above, it is possible to form an active layer with FT structure within a matrix semiconductor by the method of combining ion implantation and annealing. Incidentally, an active layer with FT structure may also be formed by combining thermal diffusion and annealing. The active layer with FT structure may be formed by a method other than those described above.

If a heteroatom S for a lattice site is combined with a heteroatom I for an interstitial site like the PF pair, a natural vibration mode different from the lattice vibration of the matrix semiconductor is generated. Therefore, it is possible to carry out structure analysis by infrared spectroscopy or Raman spectroscopy. When it comes to, for example, the PF pair, there is an infrared-active vibration mode in the vicinity of the wavenumber of 150 to 200 $cm^{-1}$, which can be detected easily. It can be confirmed easily whether an SI pair is formed in the matrix semiconductor through examination of a vibration mode by infrared spectroscopy or Raman spectroscopy.

As an indirect and simple method of detecting the presence of the SI pair, electric measurement of, for example, a resistance or Hall coefficient may also be used. In the case of using an n-type or a p-type dopant as the heteroatom S for a lattice site, the substrate before doping with the heteroatom I for an interstitial site exhibits is made in n-type or p-type and exhibits low resistance. If the heteroatom S is paired with the heteroatom I, free carriers are decreased by charge compensation between the heteroatom S and the heteroatom I, so that the resistance of the substrate is increased. Therefore, it is possible to know whether the SI pair has been formed by checking the difference in the resistance or Hall coefficient (carrier concentration) between before and after doping with the heteroatom I.

In a region where dose exceeds $10^{20}$ $cm^{-3}$, when the electronic state of the dopant is measured with XPS, a slight shift accompanying charge transfer can be observed between the spectrum of the heteroatom S alone and the spectrum after formation of the SI pair. In the SIMS measurement, it can be observed that the distribution of the heteroatoms S coincides with that of the heteroatoms I after formation of the SI pair.

First Embodiment

In this embodiment, a vertical type silicon light emitting device shown in FIG. 6A in which bond stretching is introduced in the active layer will be described. The $n^+$ layer 1 is formed on a (111) silicon substrate (not shown). Then, the active layer 2 formed on the $n^+$ layer 1 is patterned, followed by burying the SiN layer 3 in the region surrounding the active layer 2. By performing a thermal process, compressive stress is applied to the active layer 2 from the SiN layer 3 so that the active layer 2 is stretched in the <111> direction, i.e., in the normal direction to the film plane. It can be confirmed by Raman spectroscopy that about several percent of bond stretching is introduced in the <111> direction. Then, the $p^+$ layer 4 is formed on the active layer 2. In order to forcedly inject a current into the active layer 2, it is desirable to use a metal with a small work function for the n-electrode. In this case, a SrSi electrode is used as an example.

EL emission can be observed by forcedly injecting a current into the active layer 2. Although the band gap does not become of a direct transition type through Si—Si bond stretching alone, the EL emission is generated with high efficiency at a wavelength corresponding to the band gap at the Γ-point. It can be understood from the above description that the bond stretching, by which the state at the bottom of the conduction band at the Γ-point is made in the s-orbital, provides an effective method of allowing an indirect semiconductor to emit light.

PL emission through the light irradiation can also be observed. It can be understood that, since the state at the bottom of the conduction bond at the Γ-point is made in the s-orbital, emission of short life can be observed if electron-hole pairs are excited.

(Modification 1-1)

As described above, since PL emission and EL emission of high efficiency can be achieved by simply introducing strain into the active layer, it is possible to arrive at an EL light emitting device in which a reverse bias is applied to the pn junction where bond stretching is introduced.

Figure 8A:
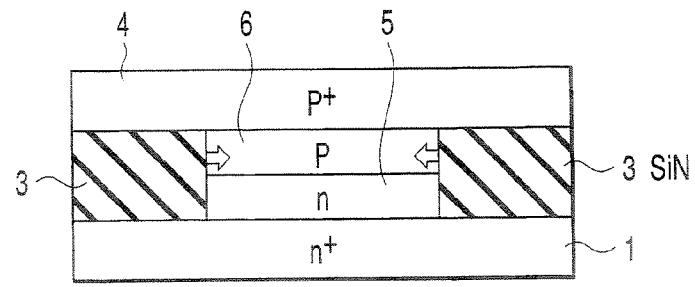
FIGS. 8A and 8B are cross-sectional views showing silicon light emitting devices of a vertical type and a lateral type according to another embodiments.

FIG. 8A shows the light emitting device in this modification. An $n^+$ layer 1 is formed on a (111) silicon substrate. Patterns of an n-layer 5 and a p-layer 6 forming a pn junction are formed on the $n^+$ layer 1, and a SiN layer 3 is buried around the patterns of the n-layer 5 and the p-layer 6. A thermal process is performed to apply compressive stress to the n and p-layers 5 and 6 from the SiN layer 3, so that the n and p-layers 5 and 6 are stretched in the <111> direction, i.e., in the normal direction to the film plane. A $p^+$ layer 4 is formed on the p-layer 6. The device is known as a Zener diode or an avalanche diode. In the case of using Si free from strain for the n and p-layers 5 and 6, the amount of the s-orbital component at the bottom of the conduction band at the Γ-point is very small and, thus, efficiency is very poor. On the other hand, the emission of high efficiency and short life can be observed by introducing the bond stretching into the n and p-layers 5 and 6.

(Modification 1-2)

Figure 9:
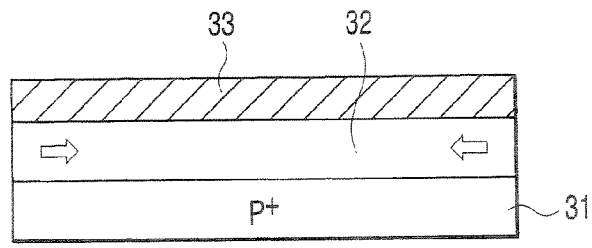
FIG. 9 is a cross-sectional view showing a vertical type silicon light emitting device according to another embodiment.

In order to introduce strain into the active layer, it is possible to apply in-plane compressive stress to the active layer by using a stacked film structure so as to stretch the active layer in the normal direction. FIG. 9 shows the light emitting device in this modification. A $p^+$ layer 31, an active layer 32, and a metal electrode layer 33 are stacked in this order on a (111) silicon substrate. It is desirable to use a metal having a small work function for the metal electrode layer 33 on the n-layer side and, thus, SrSi is used. Since SrSi has a large thermal expansion coefficient, it is possible to stretch the active layer 32 in the normal direction by applying in-plane compressive stress to the active layer 32. EL emission can be observed if a current is forcedly injected into the light emitting device.

Second Embodiment

In this embodiment, a vertical type silicon light emitting device shown in FIG. 6A in which bond stretching is introduced in the active layer comprising FT-Si will be described. The light emitting device in this embodiment can be manufactured by processes similar to those in the first embodiment except for the method of forming the active layer. The method of forming the active layer will be described below. Phosphorus atoms (P) used as the heteroatom S substituted for a lattice site of silicon, and fluorine atoms (F) used as the heteroatom I inserted into an interstitial site are ion-implanted simultaneously into the active layer. Each of the P concentration and the F concentration is about $2.5\times10^{20}/cm^3$. When the active layer is annealed at about 500° C. for a short time, the P atoms are substituted for lattice sites and the F atoms are inserted into interstitial sites adjacent to the P atoms at the lattice sites, so that stable PF pairs are formed. Whether the PF pair in the pendant type FT structure is formed in the active layer can be confirmed by microscopic infrared spectroscopy. The natural vibration mode of the PF pair appears in the low frequency region (in the vicinity of 150 to 200 $cm^{-1}$).

Also, the SiN layer 3 is buried around the active layer 2, and compressive stress is applied to the active layer 2 from the SiN layer 3 through a thermal process so as to stretch the active layer 2 in the <111> direction, i.e., in the normal direction to the film plane. It can be confirmed by Raman spectroscopy that several percent of bond stretching in the <111> direction has been introduced into the active layer. A silicon electrode doped with an n-type or p-type impurity is used as each electrode.

In the silicon light emitting device, EL emission of very high efficiency can be observed in the wavelength region corresponding to the band gap of the active layer by current injection. In the active layer having bond stretching introduced into a pendant type FT semiconductor as in this embodiment, the band gap is made in a direct transition type. In addition, the s-orbital component in the state at the bottom of the conduction band at the Γ-point occupies a considerably high ratio. Therefore, it is possible to realize emission of short life with very high efficiency.

(Modification 2-1)

As shown in FIG. 9, it is possible to stack a metal electrode layer on an active layer comprising FT-Si so as to apply in-plane compressive stress to the active layer 32, thereby stretching the active layer 32 in the normal direction. It is desirable to use a metal having a work function in the vicinity of 4 eV for the metal electrode layer 33 on the n-layer side. It is possible to introduce strain into the active layer 32 by using Ti having a large thermal expansion coefficient for the metal electrode layer 33. EL emission can be observed if a current is injected into the light emitting device.

Third Embodiment

In this embodiment, a vertical type silicon light emitting device shown in FIG. 6A in which bond stretching is introduced in the active layer comprising FT-Si will be described. The light emitting device in this embodiment can be manufactured by processes similar to those in the second embodiment, except that another FT-Si is used as the material for the active layer. The method of forming the active layer will be described below. Indium atoms (In) are used as the heteroatom S substituted for a lattice site of silicon, and sodium atoms (Na) are used as the heteroatom I inserted into an interstitial site. Each of the In concentration and the Na concentration is about $5\times10^{20}/cm^3$ and the InNa pair concentration is about $5\times10^{20}/cm^3$. Whether the InNa pair in the pendant type FT structure is formed in the active layer can be confirmed by microscopic infrared spectroscopy. The natural vibration mode of the InNa pair appears in the vicinity of 140 to 180 $cm^{-1}$.

Also, the SiN layer 3 is buried around the active layer 2, and compressive stress is applied to the active layer 2 from the SiN layer 3 through a thermal process so as to stretch the active layer 2 in the <111> direction, i.e., in the normal direction to the film plane. It can be confirmed by Raman spectroscopy that several percent of bond stretching in the <111> direction has been introduced into the active layer.

When the silicon light emitting device is driven by current injection, EL emission is generated through recombination of electrons and holes.

This embodiment also supports that the bond stretching and the pendant type FT semiconductor, which increase the s-orbital component in the state at the bottom of the conduction band at the Γ-point, are effective for a method of allowing an indirect semiconductor to emit light.

Fourth Embodiment

In this embodiment, a lateral type silicon light emitting device shown in FIG. 6B in which bond stretching is introduced in the active layer will be described. A buried oxide film 12 is formed in a (111) silicon substrate 11, and then an active layer 13, an $n^+$ layer 14 and a $p^+$ layer 15 are formed on the buried oxide film 12 in such a manner that the active layer 13 is sandwiched by $n^+$ layer 14 and $p^+$ layer 15, and further SiN layer 16 is formed around the $n^+$ layer 14 and the $p^+$ layer 15. By performing a thermal process, the active layer 13 is caused to receive compressive stress from the SiN layer 16 via the $n^+$ layer 14 and the $p^+$ layer 15 due to difference in thermal expansion coefficient among these materials. As a result, a bond in the active layer is stretched in the normal direction to the film plane. It can be confirmed by Raman spectroscopy that about several percent of bond stretching is introduced in the <111> direction. An n-electrode is connected to the $n^+$ layer 14 and a p-electrode is connected to the $p^+$ layer 15. In order to forcedly inject a current into the active layer 13, it is desirable to use a metal with a small work function for the n-electrode. In this case, a SrSi electrode is used as an example.

EL emission can be observed by forcedly injecting a current into the active layer 13. Although the band gap does not become of a direct transition type through Si—Si bond stretching alone, the EL emission is generated with high efficiency at a wavelength corresponding to the band gap at the Γ-point. It can be understood from the above description that the bond stretching, by which the state at the bottom of the conduction band at the Γ-point is made in the s-orbital, provides an effective method of allowing an indirect semiconductor to emit light.

PL emission through the light irradiation can also be observed. It can be understood that, since the state at the bottom of the conduction bond at the Γ-point is made in the s-orbital, emission of short life can be observed if electron-hole pairs are excited.

(Modification 4-1)

As described above, since PL emission and EL emission of high efficiency can be achieved by simply introducing strain into the active layer, it is possible to arrive at an EL light emitting device in which a reverse bias is applied to the pn junction where bond stretching is introduced.

Figure 8B:
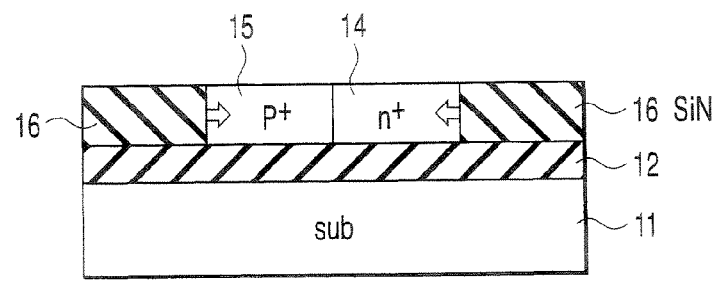

FIG. 8B shows the light emitting device in this modification. A buried oxide film 12 is formed in a (111) silicon substrate. The $n^+$ layer 14 and the $p^+$ layer 15, which form a pn junction, are formed on the buried oxide film 12. The SiN film 16 is formed around the $n^+$ layer 14 and the $p^+$ layer 15. By performing a thermal process, the $n^+$ layer 14 and the $p^+$ layer 15 receive compressive stress from the SiN layer 16 due to difference in thermal expansion coefficient, so that the bonds in the $n^+$ layer 14 and the $p^+$ layer 15 are stretched in the normal direction to the film plane. The device is known as a Zener diode or an avalanche diode. In the case of using Si free from strain for the $n^+$ and $p^+$ layers 14 and 15, the amount of the s-orbital component at the bottom of the conduction band at the Γ-point is very small and, thus, efficiency is very poor. On the other hand, the emission of high efficiency and short life can be observed by introducing the bond stretching into $n^+$ and $p^+$ layers 14 and 15.

(Modification 4-2)

Figure 10:
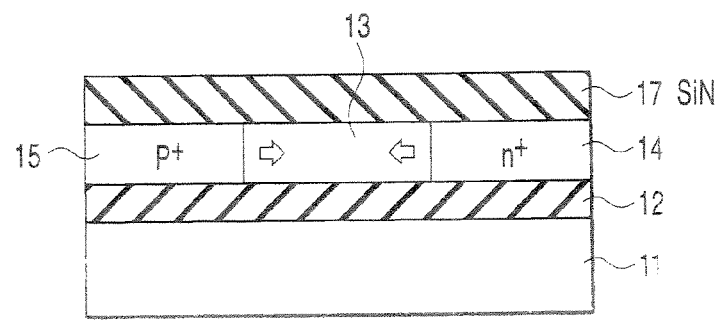
FIG. 10 is a cross-sectional view showing a lateral type silicon light emitting device according to another embodiment.

In order to introduce strain into the active layer, it is possible to apply in-plane compressive stress to the active layer by using a stacked film structure so as to stretch the active layer in the normal direction. FIG. 10 shows the light emitting device in this modification. A buried oxide film 12 is formed in a (111) silicon substrate 11. The active layer 13, and the $n^+$ layer 14 and the $p^+$ layer 15, which sandwich the active layer 13, are formed on the buried oxide film 12. A SiN layer 17 is stacked to cover the active layer 13, the $n^+$ layer 14 and the $p^+$ layer 15. By performing a thermal process, the active layer 13 receives compressive stress from the SiN layer 17 due to difference in thermal expansion coefficient therebetween, so that a bond is stretched in the normal direction to the film plane. EL emission can be observed if a current is forcedly introduced into the light emitting device.

Fifth Embodiment

In this embodiment, a lateral type silicon light emitting device shown in FIG. 6B in which bond stretching is introduced in the active layer comprising FT-Si will be described. The light emitting device in this embodiment can be manufactured by processes similar to those in the fourth embodiment except for the method of forming the active layer. The method of forming the active layer will be described below. Phosphorus atoms (P) are used as the heteroatom S substituted for a lattice site of silicon, and fluorine atoms (F) are used as the heteroatom I inserted into an interstitial site. Each of the P concentration and the F concentration is about $2 \times 10^{20}/cm^3$. Whether the PF pair in the pendant type FT structure is formed in the active layer can be confirmed by microscopic infrared spectroscopy. The natural vibration mode of the PF pair appears in the low frequency region (in the vicinity of 150 to 200 $cm^{-1}$).

Also the $n^+$ layer 14 and the $p^+$ layer 15, which sandwich the active layer 13, and the SiN layer 16 around the $n^+$ layer 14 and the $p^+$ layer 15 are formed. By performing a thermal process, the active layer 13 receive compressive stress from the SiN layer 16 via the $n^+$ layer 14 and the $p^+$ layer 15 due to difference in thermal expansion coefficient therebetween, so that a bond in the active layer 13 is stretched in the normal direction to the film plane. It can be confirmed by Raman spectroscopy that several percent of bond stretching in the <111> direction has been introduced into the active layer. A silicon electrode doped with an n-type or p-type impurity is used as each electrode.

In the silicon light emitting device, EL emission of very high efficiency can be observed in the wavelength region corresponding to the band gap of the active layer by current injection. In the active layer having bond stretching introduced into a pendant type FT semiconductor as in this embodiment, the band gap is made in a direct transition type. In addition, the s-orbital component in the state at the bottom of the conduction band at the Γ-point occupies a considerably high ratio. Therefore, it is possible to realize emission of short life with very high efficiency.

(Modification 5-1)

In order to introduce strain into the active layer, it is possible to stack a SiN layer on the active layer comprising FT-Si so as to apply in-plane compressive stress to the active layer, thereby stretching the active layer in the normal direction. FIG. 10 shows the light emitting device in this modification. A buried oxide film 12 is formed in a (111) silicon substrate. An active layer 13 comprising FT-Si, and an n⁺ layer 14 and a p⁺ layer 15, which sandwich the active layer 13, are formed on the buried oxide film 12. The SiN layer 17 is stacked to cover the active layer 13, the n⁺ layer 14 and the p⁺ layer 15. By performing a thermal process, the active layer 13 receives compressive stress from the SiN layer 17 due to difference in thermal expansion coefficient therebetween, so that a bond is stretched in the normal direction to the film plane. EL emission can be observed if a current is forcedly introduced into the light emitting device.

Sixth Embodiment

Figure 11A:
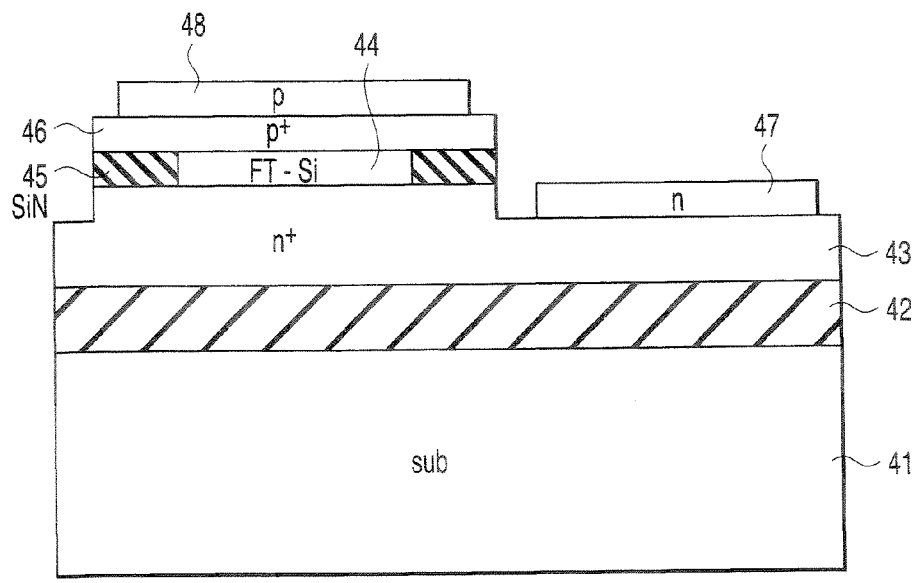
FIGS. 11A and 11B are a cross-sectional view and a perspective view, respectively, showing an edge-emitting silicon light emitting device according to a sixth embodiment.
Figure 11B:
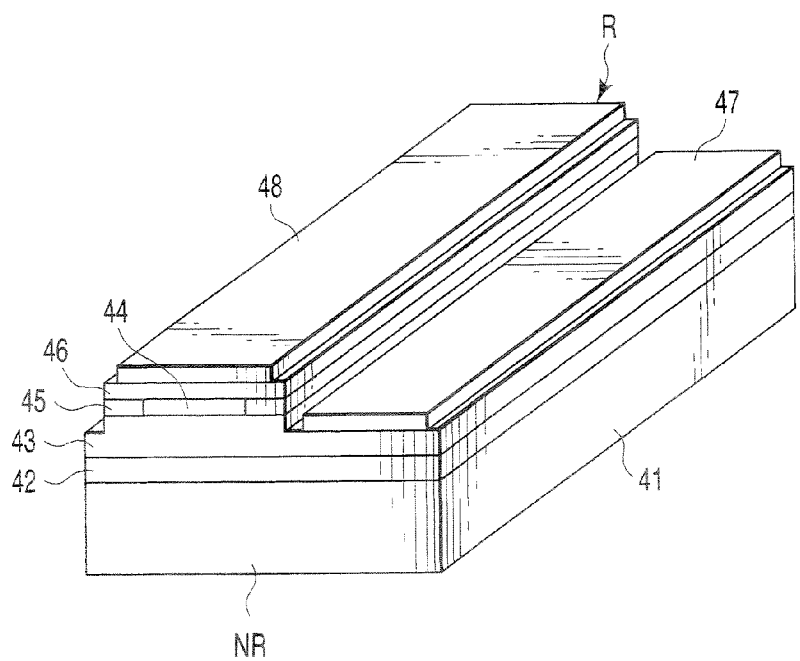

FIGS. 11A and 11B are a cross-sectional view and a perspective view, respectively, showing an edge-emitting silicon light emitting device in this embodiment. A buried oxide film 42 is formed in a semi-insulating (111) silicon substrate 41, and a P-doped n⁺ layer 43 is formed on the buried oxide film 42. An active layer 44 comprising FT-Si is formed on the n⁺ layer 43, and a SiN layer 45 is buried around the active layer 44. The active layer 44 is formed of PF-doped FT-Si in which matrix silicon is doped with the P atom used as the heteroatom S substituted for a lattice site and with the F atom used as the heteroatom I inserted into an interstitial site. The PF pair concentration is about $3 \times 10^{20}/cm^3$. By performing a thermal process, compressive stress is applied to the active layer 44 from the SiN layer 45, so that the active layer 44 is stretched in the <111> direction, i.e., in the normal direction to the film plane. A B-doped p⁺ layer 46 is formed to cover the active layer 44 and the SiN layer 45. The p⁺ layer 46, the SiN layer 45 and the n⁺ layer 43 are etched partly, and an n-electrode 47 connected to the n⁺ layer 43 and a p-electrode 48 connected to the p⁺ layer 45 are formed. Each of the n-electrode 47 and the p-electrode 48 comprises Ni silicide/Au. As shown in FIG. 11B, one edge surface of the light emitting device is coated with an antireflection coating NR, and the other edge surface of the light emitting device is coated with a reflection coating R. In the structure, light is radiated from the edge surface coated with the antireflection coating NR.

When a current is supplied for driving the light emitting device, electrons and holes are recombined in the active layer 44 comprising FT-Si so that EL emission is generated. The emission exhibits short life and high efficiency, which supports that the bond stretching and the pendant type FT semiconductor are effective.

Seventh Embodiment

Figure 12A:
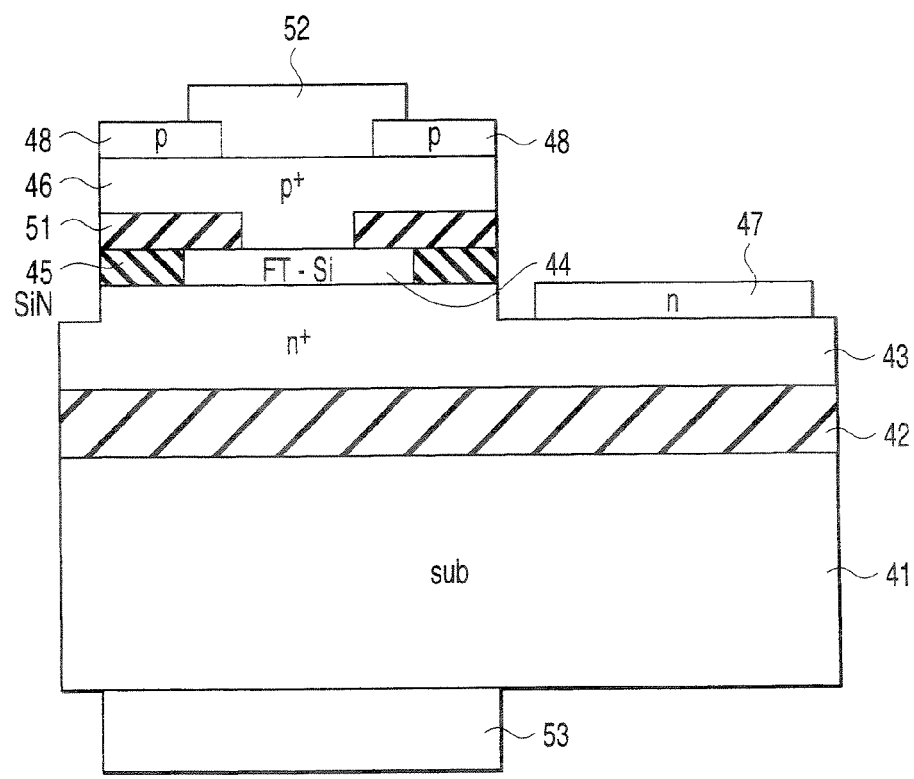
FIGS. 12A and 12B are a cross-sectional view and a perspective view, respectively, showing a surface-emitting silicon light emitting device according to a seventh embodiment.
Figure 12B:
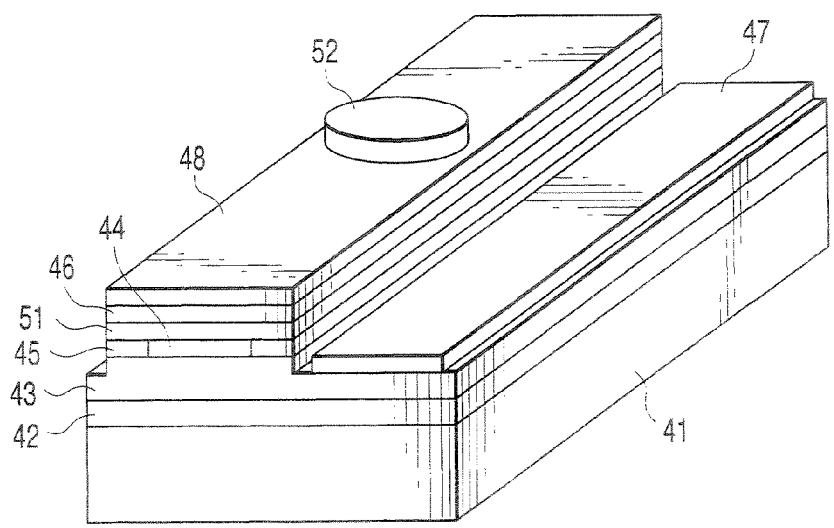

FIGS. 12A and 12B are a cross-sectional view and a perspective view, respectively, showing a surface-emitting silicon light emitting device in this embodiment. A buried oxide film 42 is formed in a semi-insulating (111) silicon substrate 41, and an n⁺ layer 43 doped with P atoms is formed on the buried oxide film 42. An active layer 44 comprising FT-Si is formed on the n⁺ layer 43, and a SiN layer 45 is buried around the active layer 44. The active layer 44 is formed of PF-doped FT-Si in which matrix silicon is doped with the P atom used as the heteroatom S substituted for a lattice site and with the F atom used as the heteroatom I inserted into an interstitial site. The PF pair concentration is about $7 \times 10^{20}/cm^3$. By performing a thermal process, compressive stress is applied to the active layer 44 from the SiN layer 45, so that the active layer 44 is stretched in the <111> direction, i.e., in the normal direction to the film plane. An insulating layer 51 and a B-doped p⁺ layer 46 are formed to cover the active layer 44 and the SiN layer 45. The p⁺ layer 46, the insulating layer 51, the SiN layer 45 and the n⁺ layer 43 are etched partly, and an n-electrode 47 connected to the n⁺ layer 43 and a p-electrode 48 connected to the p⁺ layer 45 are formed. The p-electrode 48 is patterned so as to be arranged above the insulating layer 51. Each of the n-electrode 47 and the p-electrode 48 comprises Ni silicide/Au. In the light emitting device in this embodiment, EL emission is taken out from the front surface through the p⁺ layer 46. Therefore, the active layer 44 and the p-electrode 48 are designed to diminish overlapping thereof (i.e., to diminish the overlapping to a level close to zero) so as to prevent the active layer 44 from being concealed by the p-electrode 48. An antireflection coating 52 is formed on the p⁺ layer 46 on the front surface, and a reflection coating 53 is formed on the rear surface of the substrate 41. Reflection coatings are formed on both edge surfaces. In this structure, the light is radiated from the antireflection coating 52 on the front surface.

When a current is supplied for driving the light emitting device, electrons and holes are recombined in the active layer 44 comprising FT-Si so that EL emission is generated. The emission exhibits short life and high efficiency, which supports that the bond stretching and the pendant type FT semiconductor are effective.

Eighth Embodiment

Figure 13A:
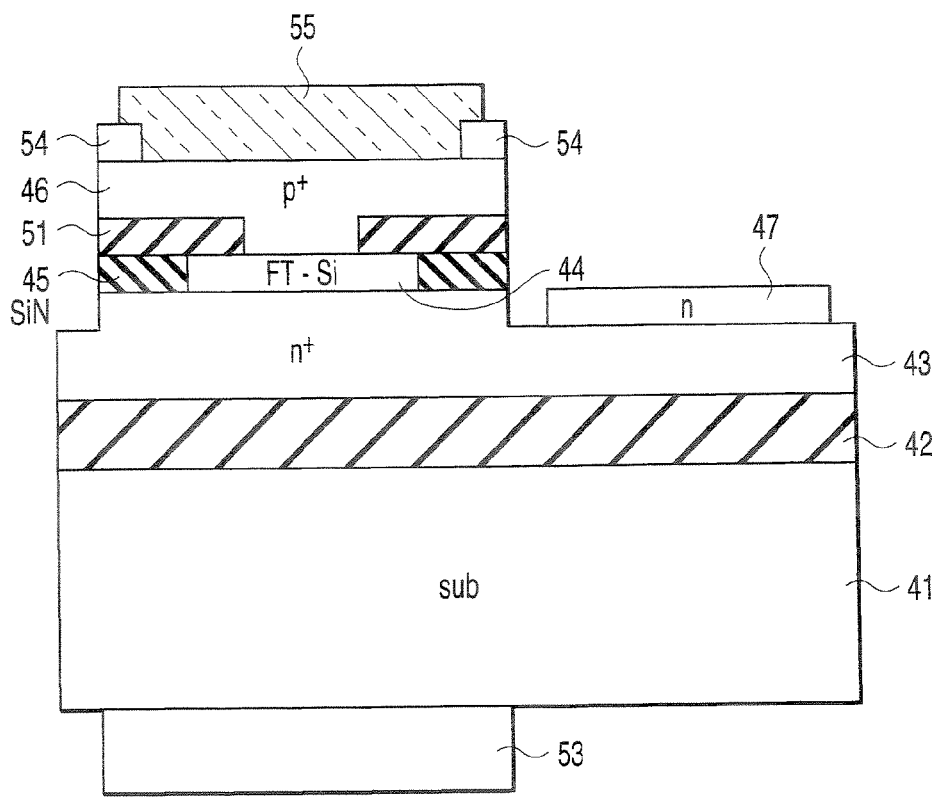
FIGS. 13A and 13B are a cross-sectional view and a perspective view, respectively, showing a surface-emitting silicon light emitting device according to an eighth embodiment.
Figure 13B:
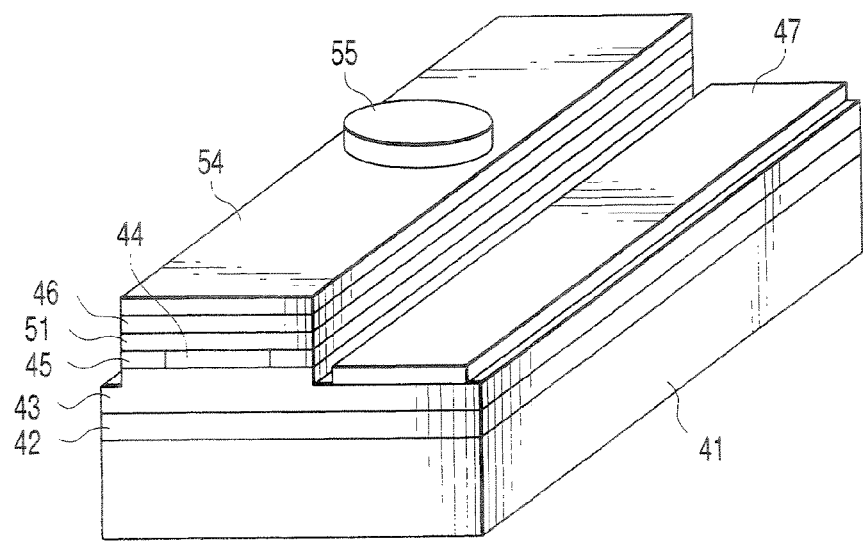

FIGS. 13A and 13B are a cross-sectional view and a perspective view, respectively, showing a surface-emitting silicon light emitting device in this embodiment. In the light emitting device, an auxiliary electrode 54 and a transparent electrode 55 are formed in place of the antireflection coating 52 formed in the light emitting device according to the seventh embodiment.

When a current is supplied for driving the light emitting device, electrons and holes are recombined in the active layer 44 comprising FT-Si so that EL emission is generated. The emission exhibits short life and high efficiency, which supports that the bond stretching and the pendant type FT semiconductor are effective.

Ninth Embodiment

FIGS. 14A and 14B are a cross-sectional view and a perspective view, respectively, each showing an edge-emitting laser diode (referred to as an LD device hereinafter) in this embodiment. The LD device is an edge-emitting device having a ridge waveguide structure. A buried oxide film 62 is formed in a semi-insulating (111) silicon substrate 61, and a P-doped n⁺ layer 63 is formed on the buried oxide film 62. An active layer 64 comprising FT-Si is formed on the n⁺ layer 63, and a SiN layer 65 is buried around the active layer 64. The active layer 64 is formed of PF-doped FT-Si in which matrix silicon is doped with the P atom used as the heteroatom S substituted for a lattice site and with the F atom used as the heteroatom I inserted into an interstitial site. The PF pair concentration is about $5 \times 10^{20}/cm^3$. By performing a thermal process, compressive stress is applied to the active layer 64 from the SiN layer 65 so that the active layer 64 is stretched in the <111> direction, i.e., in the normal direction to the film plane. The p⁺ layer 66, the SiN layer 65 and the n⁺ layer 63 are partly etched, and an n-electrode 67 connected to the n⁺ layer 63 and a p-electrode 68 connected to the p⁺ layer 66 are formed. Further, the p-electrode 68 and the p⁺ layer 66 are partly etched. Each of the n-electrode 67 and the p-electrode 68 comprises Ni silicide/Au. As shown in FIG. 14B, a dielectric multi-layered mirror LR with a low reflectivity is formed on one edge surface of the LD device, and a dielectric multi-layered mirror HR with a high reflectivity is formed on the other edge surface.

When a current is supplied for driving the LD device, it is possible to oscillate laser light from the edge surface. The emission spectrum shows that the spectrum is broad under a current lower than the threshold value and that the spectrum is sharpened and is made monochromatic under a current higher than the threshold value. This suggests that, under the current higher than the threshold value, continuous laser oscillation can be attained.

Various materials other than those exemplified in the above embodiment can be used for the FT semiconductor of the active layer. For example, B atoms can be used as the heteroatoms S and Li atoms can be used as the heteroatoms I in the Si matrix. Also, various other modifications can be employed within the scope of the present invention.

Tenth Embodiment

Figure 15A:
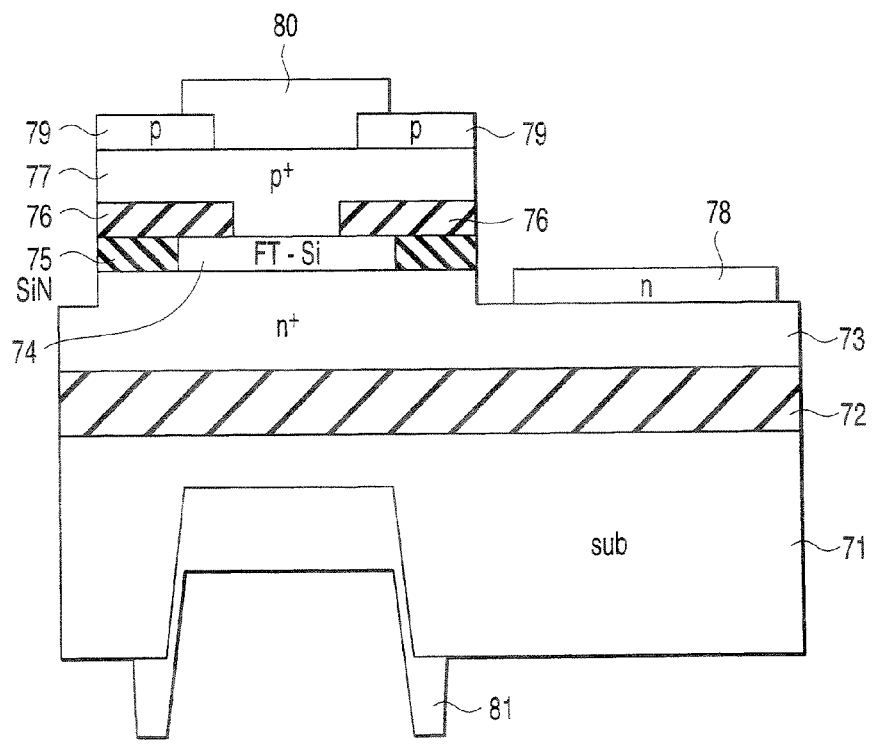
FIGS. 15A and 15B are a cross-sectional view and a perspective view, respectively, showing a surface-emitting LD device according to a tenth embodiment.
Figure 15B:
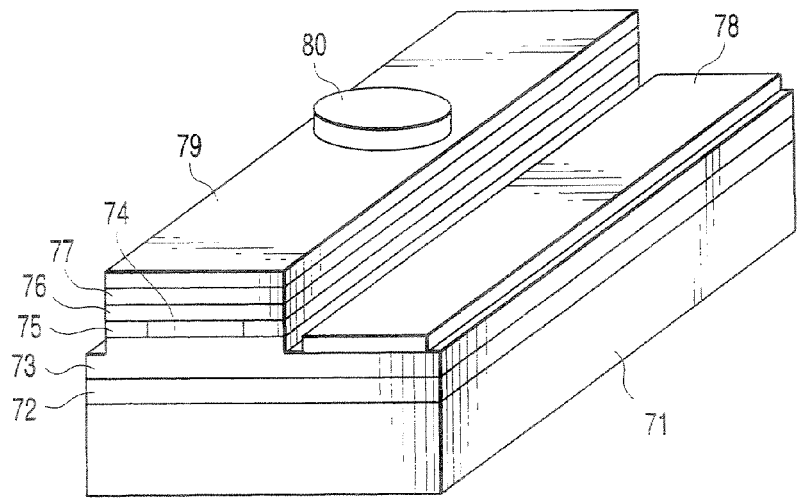

FIGS. 15A and 15B are a cross-sectional view and a perspective view, respectively, showing a surface-emitting LD device in this embodiment. A buried oxide film 72 is formed in a semi-insulating (111) silicon substrate 71, and a P-doped n$^+$ layer 73 is formed on the buried oxide film 72. An active layer 74 comprising FT-Si is formed on the n$^+$ layer 73, and a SiN layer 75 is buried around the active layer 74. The active layer 74 is formed of PF-doped FT-Si in which matrix silicon is doped with the P atom used as the heteroatom S substituted for a lattice site and with the F atom used as the heteroatom I inserted into an interstitial site. The PF pair concentration is about $7 \times 10^{20}/cm^3$. By performing a thermal process, compressive stress is applied to the active layer 74 from the SiN layer 75 so that the active layer 74 is stretched in the <111> direction, i.e., in the normal direction to the film plane. An insulating layer 76 and a B-doped p$^+$-layer 77 is formed to cover the active layer 74 and the SiN layer 75. The p$^+$ layer 77, the insulating layer 76, the SiN layer 75 and the n$^+$ layer 73 are partly etched, and an n-electrode 78 connected to the n$^+$ layer 73 and a p-electrode 79 connected to the p$^+$ layer 77 are formed. Each of the n-electrode 78 and the p-electrode 79 comprises Ni silicide/Au. The p-electrode 79 is partly etched, and a dielectric multi-layered mirror 80 of a low reflectivity is formed. A dielectric multi-layered mirror 81 of a high reflectivity is formed on the rear surface of the substrate 71 positioned to face the dielectric multi-layered mirror 80 of a low reflectivity.

When a current is supplied for driving the LD device, it is possible to oscillate laser light from the front surface. The spectrum is sharpened and is made monochromatic under a current higher than the threshold value. Under a current higher than the threshold value, continuous laser oscillation can be attained.

Eleventh Embodiment

Figure 16:
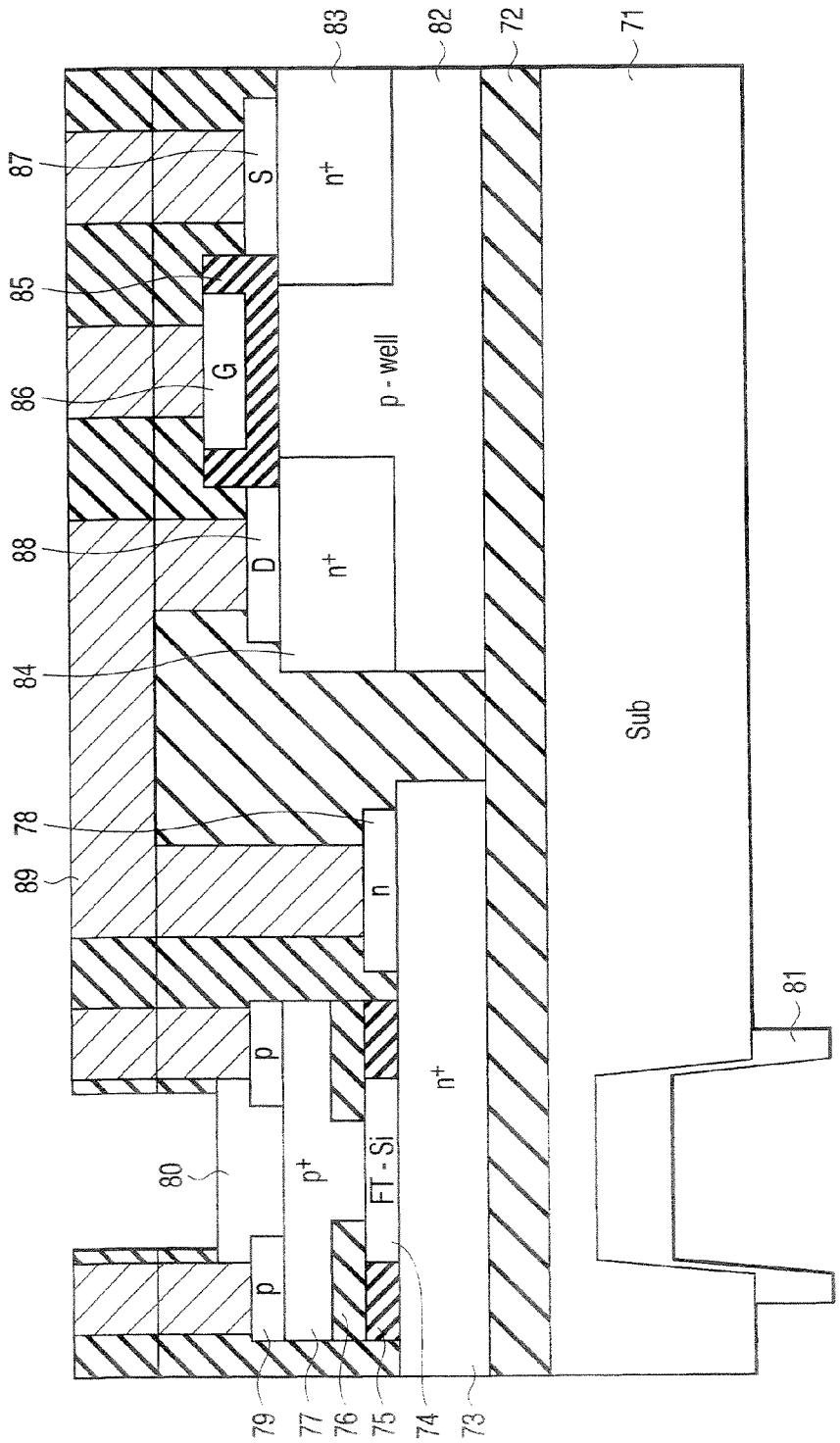
FIG. 16 is a cross-sectional view showing a photoelectric device array according to an eleventh embodiment.

FIG. 16 shows a photoelectric device array in this embodiment. The photoelectric device array is prepared by forming on the same substrate an integrated circuit comprising a light emitting device and a switching device (MOS transistor) adapted to modulate the light output of the light emitting device. The light emitting device is formed of the surface emitting LD having a structure similar to that in the tenth embodiment. On the other hand, a p-well region 82, n$^+$ source and drain regions 83, 84 are formed on the buried oxide film 72 formed in the substrate 71, and a gate insulating film 85 and a gate electrode 86 are formed between the source-drain regions 83, 84. Source-drain electrodes 87, 88 are formed on the source-drain regions 83, 84, respectively. Further, the n-electrode 78 of the LD device is connected to the drain electrode 88 of the MOS transistor via a wire 89.

Figure 17:
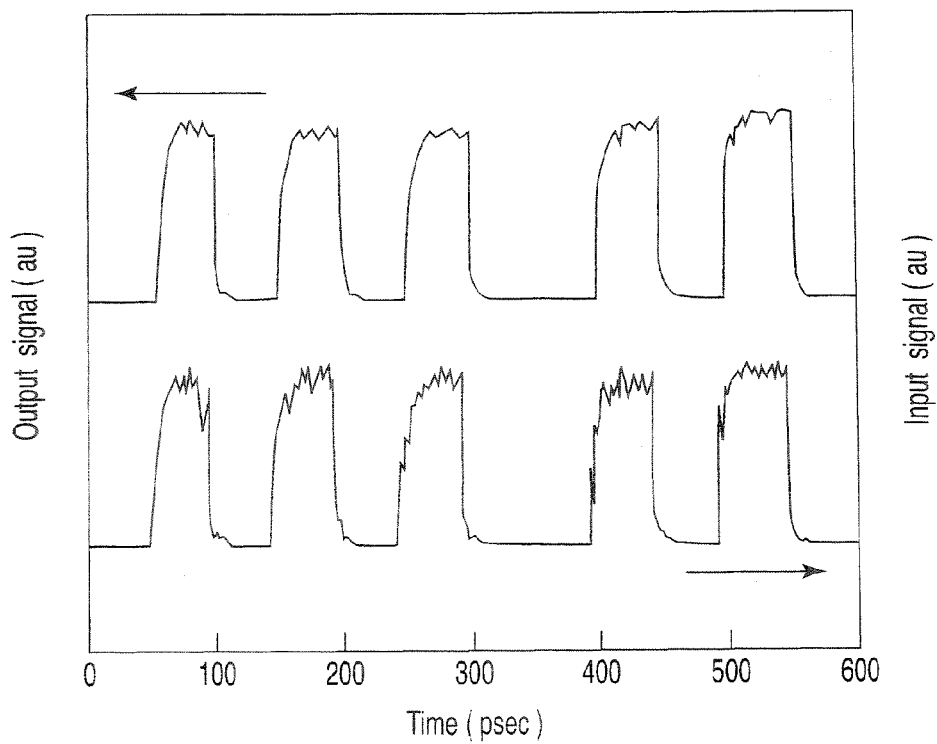
FIG. 17 is a graph showing response characteristics of the LD device in the photoelectric device array according to the eleventh embodiment.

FIG. 17 is a graph showing the modulated signal (electric signal) supplied to the transistor and the response of the output light generated from the LD device. As apparent from FIG. 17, the output light is modulated at the same frequency of 10 GHz relative to the high-speed modulated signal of 10 GHz. This indicates that the photoelectric device array in this embodiment enables high-speed direct modulation. Although a costly light modulation element is conventionally required for coding the output of the LD device, a light modulation element is not necessary in this embodiment.

Twelfth Embodiment

Figure 18:
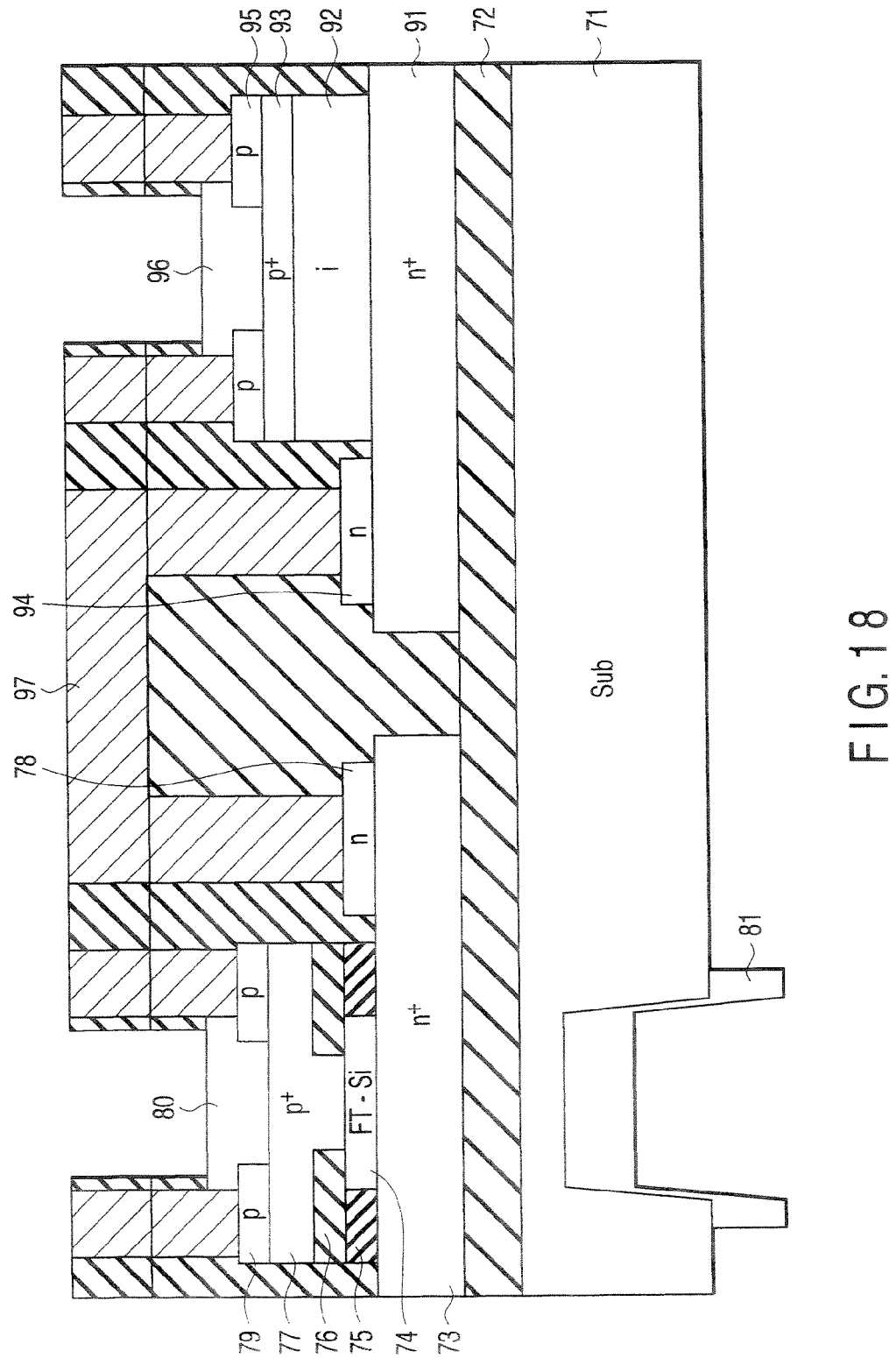
FIG. 18 is a cross-sectional view showing a light receiving-emitting device array according to a twelfth embodiment.

FIG. 18 shows the light receiving-emitting device array in this embodiment. The light receiving-emitting device array is prepared by forming on the same substrate an integrated circuit comprising a light receiving device and a light emitting device. The light receiving-emitting device array produces the functions of processing the received optical signal and outputting the result of the processing as a new optical signal. The light emitting device is formed of a surface-emitting LD device having a structure similar to that in the tenth embodiment. On the other hand, the light receiving device is formed of a germanium light receiving device. An n$^+$ layer 91, an i-layer 92, and a p$^+$ layer 93 are formed on the buried oxide film 72 formed in the substrate 71. The p$^+$ layer 93, the i-layer 92, and the n$^+$ layer 91 are partly etched, and an n-electrode 94 connected to the n$^+$ layer 91 is formed. A p-electrode 95 is formed on the p$^+$ layer 93. The p-electrode 95 is partly etched, and a non-reflective layer 96 is formed. The light receiving device and the light emitting device are connected in series via a wire 97. The light receiving-emitting device array has a relaying function for outputting the input optical signal with its waveform left unchanged.

Figure 19:
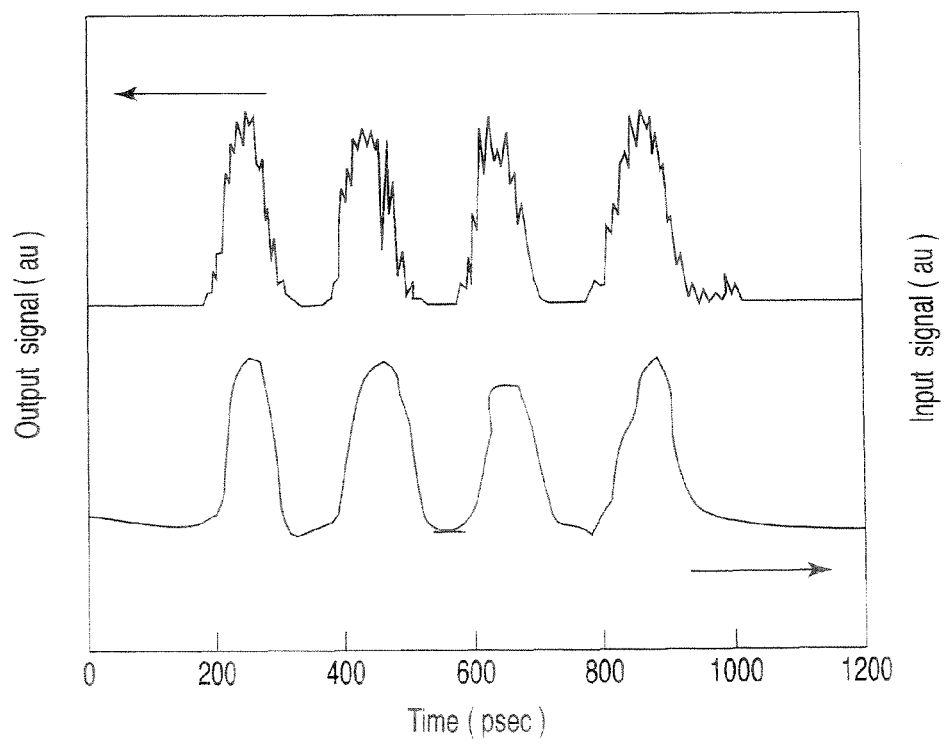
FIG. 19 is a graph showing response characteristics of the LD device included in the light receiving-emitting array according to the twelfth embodiment.

FIG. 19 is a graph showing the optical signal supplied to the light receiving device and having a wavelength of 850 nm and response of the output light generated from the LD device. As apparent from FIG. 19, an output light of the same waveform is obtained relative to an input signal modulated under the frequency of 5 GHz. In this fashion, the light receiving-emitting device array in this embodiment permits a signal relay at a high speed.

Thirteenth Embodiment

Figure 20:
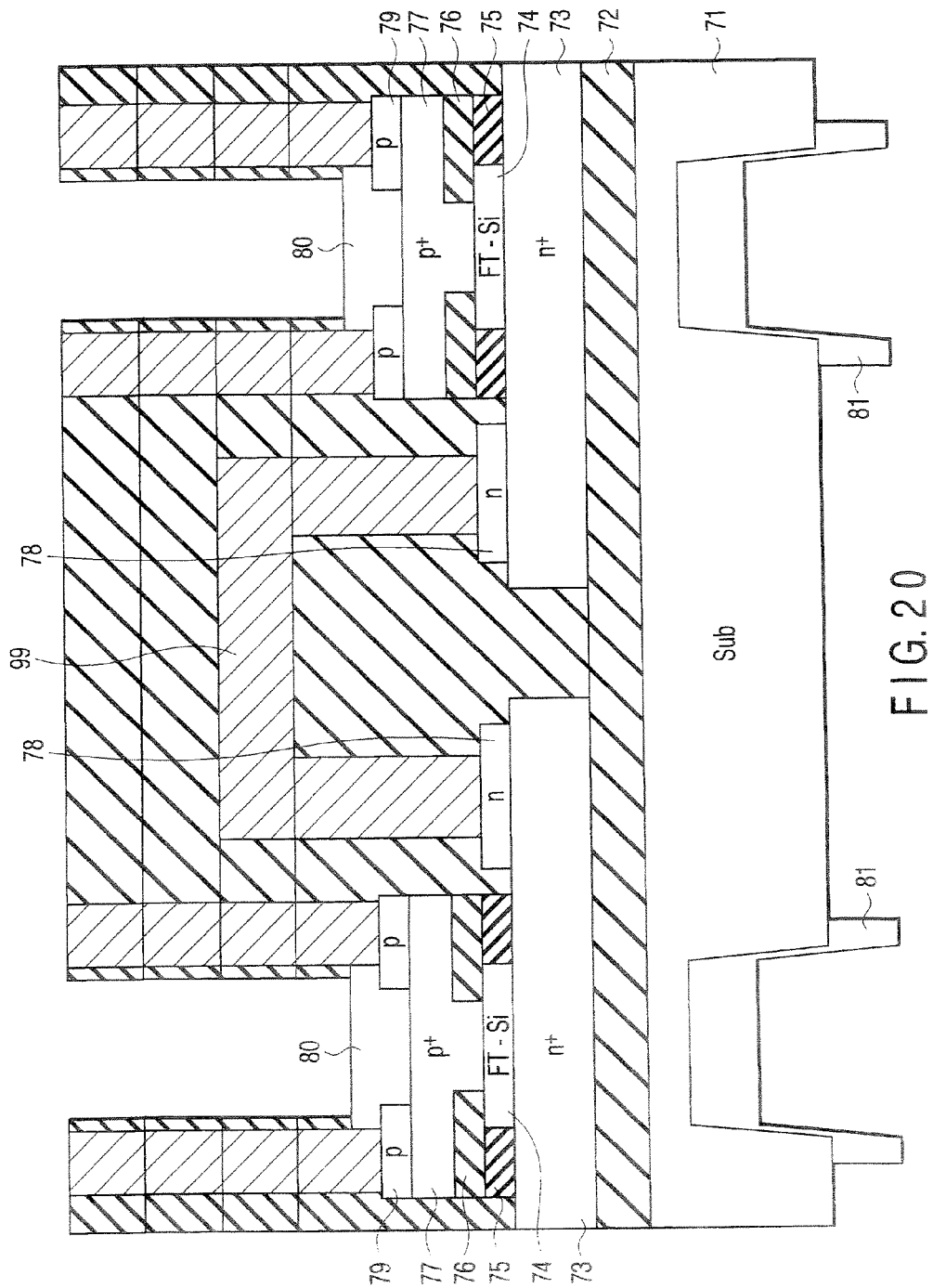
FIG. 20 is a cross-sectional view showing a light-emitting device array according to a thirteenth embodiment.

FIG. 20 shows the light emitting device array in this embodiment. In this light emitting device array, plural light emitting devices are formed integrally on the same substrate for optically outputting an image signal. Each of the plural light emitting devices is equal to the surface-emitting LD device as described in the tenth embodiment. The plural light emitting devices are connected to each other via a wire 99.

Figure 21B:
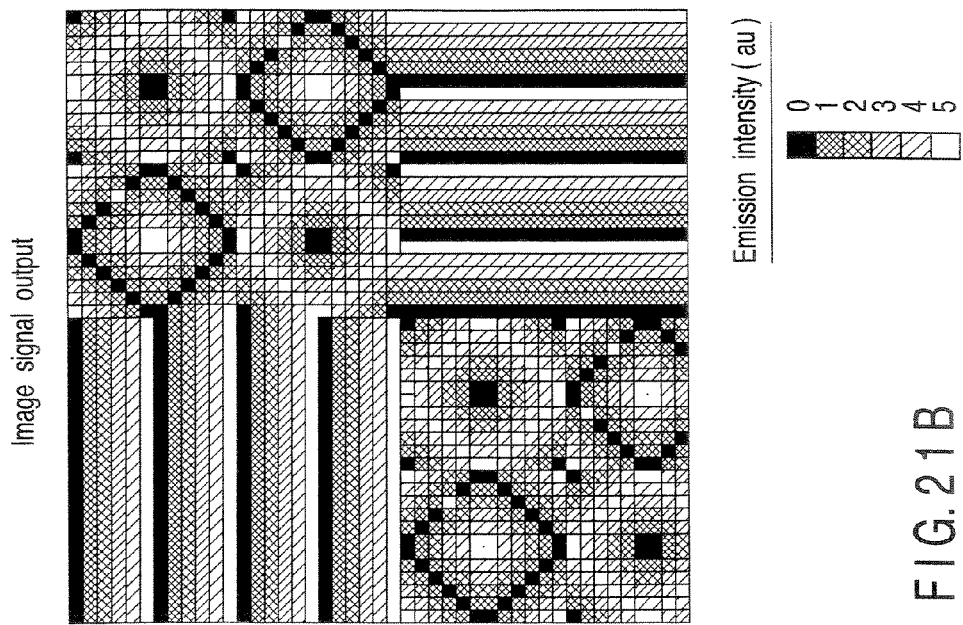
FIGS. 21A and 21B show the input image and the output image, respectively, of the LD device in the light emitting device array according to the thirteenth embodiment.
Figure 21A:
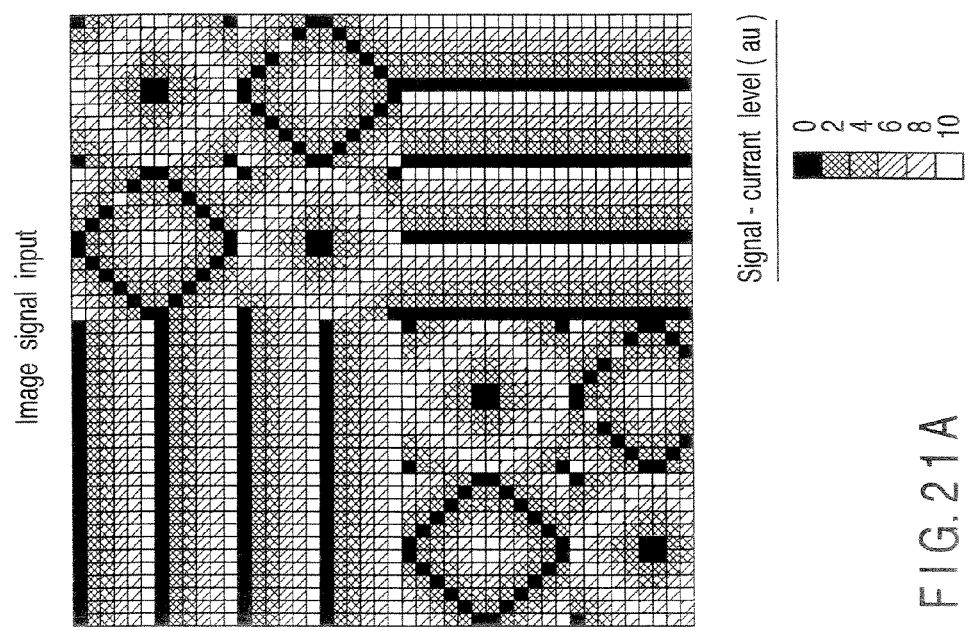

FIGS. 21A and 21B show an image signal (electric signal) supplied to the LD device array and an output image (optical signal) generated from the LD device array. As apparent from FIGS. 21A and 21B, it is possible to obtain an output image reproducing the input image with high fidelity.

Fourteenth Embodiment

Figure 22:
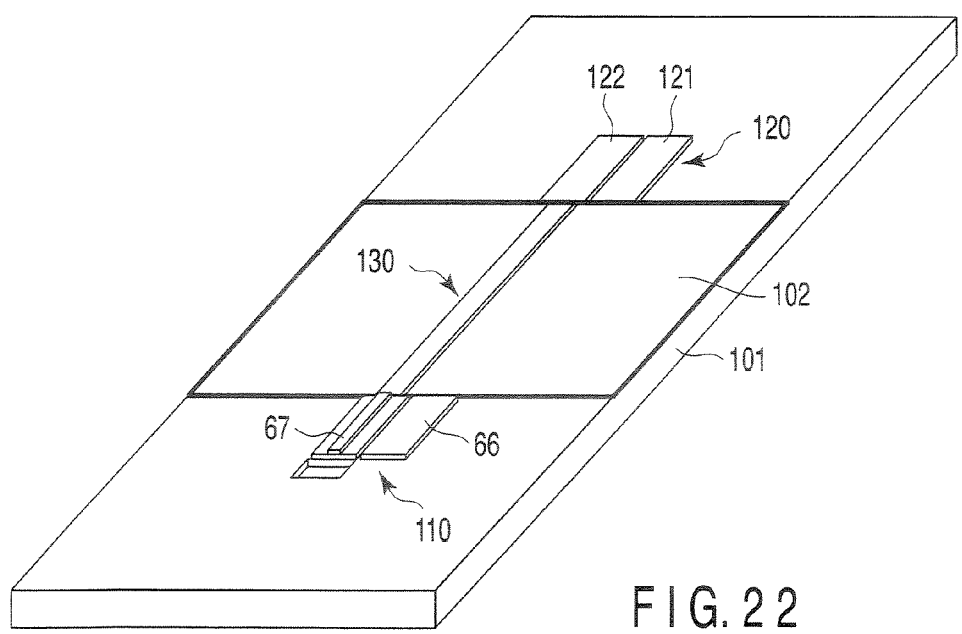
FIG. 22 is a perspective view showing an optical device array according to a fourteenth embodiment.

FIG. 22 shows the optical device array in this embodiment. In this optical device array, a light emitting device, a light receiving device and a waveguide for connecting the light receiving device and the light emitting device are formed integrally on the same substrate. The optical device array permits generating, transmitting and receiving an optical signal.

As shown in FIG. 22, an edge-emitting LD device 110 for generating a signal and a germanium light receiving device 120 for receiving the signal are formed on a silicon substrate 101. An oxide film 102 is formed between the LD device 110 and the light receiving device 120, and a Si waveguide 130 for transmitting the optical signal is formed on the oxide film 102. The edge-emitting LD device 110 is equal in structure to that of the ninth embodiment. The n-electrode 66 and the p-electrode 67 are shown in FIG. 22. A trench is formed in the substrate 101 in the vicinity of the LD device 110 so as to expose the edge surface to the outside. FIG. 22 also shows an n-electrode 121 and a p-electrode 122 in respect of the germanium light receiving device 120.

Figure 23:
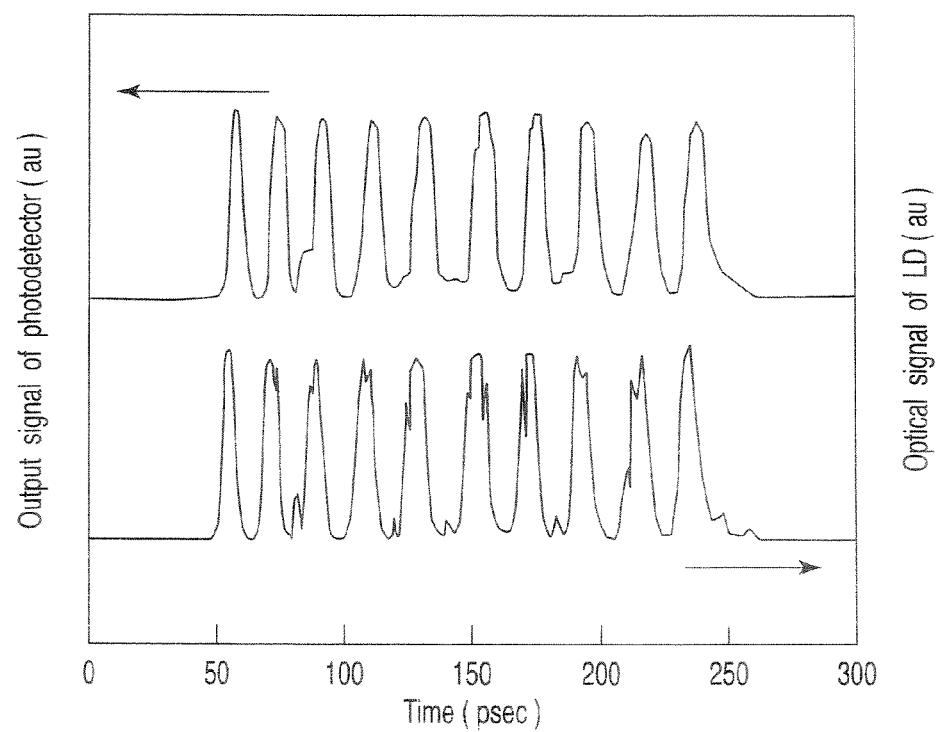
FIG. 23 is a graph showing response characteristics of the light-receiving device relative to the input signal supplied from the LD device in the optical device array according to the fourteenth embodiment.

FIG. 23 is a graph showing the optical signal generated from the LD device and the output response of the light receiving device. As apparent from FIG. 23, the output signal is modulated under the frequency of 50 GHz relative to the high-speed modulated signal under the frequency of 50 GHz. In this fashion, the optical device array in this embodiment permits transmission of an optical signal at a high speed. It is technically impossible in the conventional technique to form an optical wiring unit for transmitting an optical signal on a wafer. However, this embodiment makes it possible to form such an optical wiring unit.

Fifteenth Embodiment

In this embodiment, a phosphor that can be excited by a light source, an electron source or an X-ray source will be described. The phosphor is in the form of powdery crystals each including FT semiconductor of the ISSI pair structure having a stretched interatomic bond. The FT semiconductor is formed of an FT-SiC doped with FAs—AsF, comprising silicon carbide (SiC) used as the matrix semiconductor, As atoms used as the heteroatom S, and F atoms used as the heteroatoms I. The AsF-pair concentration is set at three values of $9\times10^{17}/cm^3$, $1.2\times10^{19}/cm^3$, and $1.6\times10^{20}/cm^3$, respectively. The AsAs-pair structure is formed first, and then F atoms are introduced into the matrix semiconductor. It can be confirmed by a frequency spectrum of Raman scattering that, after introduction of the AsAs-pair, the distance between the pair is increased than the distance between Si—C.

The band calculation of the FT-SiC doped with the AsF pair shows that the band gap is in the vicinity of 2.5 eV. Therefore, it is expected that blue green-emitting phosphor can be provides. Since bond stretching is introduced into the substance, the state at the bottom of the conduction band contains substantially completely the s-orbital component. The interband transition in this substance is dipole transition whose radiative recombination life is short and exhibits intense emission.

If such a phosphor is excited with ultraviolet ray, electron-hole pairs are formed, which generate recombination emission in a blue green range.

It is possible to use various phosphor materials other than those described above. The examples of the phosphor materials include that comprising SiC as the matrix semiconductor, B atom as the heteroatom S, and Li atoms as the heteroatoms I; that comprising BP as the matrix semiconductor, O atom as the heteroatoms S, and F atom as the heteroatoms I. Further, it is possible to use the materials described above in appropriate combinations.

Sixteenth Embodiment

The phosphor in this embodiment is formed of FT-SiC doped with KGa—GaK comprising silicon carbide (SiC) as the semiconductor matrix material, Ga atom as the heteroatom S, and K atom as the heteroatoms I. The concentration of the KGa—GaK pairs is about $8\times10^{19}/cm^3$. It can be confirmed by a frequency spectrum of Raman scattering that the distance between KGa—GaK pair is increased than the distance between Si—C.

The band calculation of the FT-SiC doped with KGa—GaK pair shows that the band gap is in the vicinity of 2.9 eV. Therefore, it is expected that blue-emitting phosphor can be provided. Since bond stretching is introduced into the substance, the state at the bottom of the conduction band contains substantially completely the s-orbital component. The interband transition in this substance is dipole transition whose radiative recombination life is short and exhibits intense emission.

If such a phosphor is excited with ultraviolet ray, electron-hole pairs are formed, which generate recombination emission in a blue range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting material, comprising:
   a first film of semiconductor substance whose constituent atoms are bonded to form a tetrahedral structure, the first film comprising an n-layer and a p-layer stacked on one another to form a pn junction;
   second films that are different from the first film in thermal expansion coefficient or in lattice constant wherein the second films are arranged on both sides of the first film in a same plane; and
   an $n^+$ layer and a $p^+$ layer arranged below and above the first film, the $n^+$ layer being in contact with the n-layer and the $p^+$ layer being in contact with the p layer,
   wherein the first film receives a stress from the second films so as to be stretched in a <111> direction or a direction equivalent thereto.

2. The material according to claim 1, wherein the constituent atom of the semiconductor substance is silicon, and wherein the first film is stretched in a crystal orientation by 1% or more and 12% or less.

3. The material according to claim 1, wherein the second film comprises a SiN layer.

4. A semiconductor light-emitting material, comprising
   a first film of semiconductor substance whose constituent atoms are bonded to form a tetrahedral structure;
   second films that are different from the first film in thermal expansion coefficient or in lattice constant wherein the second films are arranged on both sides of the first film in a same plane, and an $n^+$ layer arranged between the first film and one second film and a $p^+$ layer arranged between the first film and the other second film,
   wherein the first film receives a stress from the second films so as to be stretched in a <111> direction or a direction equivalent thereto.

5. A semiconductor light-emitting material, comprising:
   a first film of semiconductor substance whose constituent atoms are bonded to form a tetrahedral structure, the first film comprising an n⁺ layer and a p⁺ layer arranged laterally to form a pn junction, and second films that are different from the first film in thermal expansion coefficient or in lattice constant wherein the second films are arranged on both sides of the first film in a same plane, wherein the first film receives a stress from the second films so as to be stretched in a <111> direction or a direction equivalent thereto.

6. A semiconductor light-emitting material, comprising:

a first film of semiconductor substance whose constituent atoms are bonded to form a tetrahedral structure;

an n⁺ layer and a p⁺ layer arranged on both sides of the first film in a same plane, and a second film different from the first film in thermal expansion coefficient or in lattice constant wherein the second film being stacked on the first film of the semiconductor substance, wherein the first film receives a stress from the second film so as to be stretched in a <111> direction or a direction equivalent thereto.

7. The material according to claim 6, wherein the constituent atom of the semiconductor substance is silicon, and wherein the first film is stretched in a crystal orientation by 1% or more and 12% or less.

8. The material according to claim 6, wherein the second film comprises a SiN layer.

\* \* \* \* \*